(12) United States Patent
Singh

(10) Patent No.: US 12,211,165 B2
(45) Date of Patent: Jan. 28, 2025

(54) DEFORMING POINTS IN SPACE USING A CURVE DEFORMER

(71) Applicant: Unity Technologies SF, San Francisco, CA (US)

(72) Inventor: Karan Singh, Toronto (CA)

(73) Assignee: Unity Technologies SF, San Francisco, CA (US)

( * ) Notice: Subject to any disclaimer, the term of this patent is extended or adjusted under 35 U.S.C. 154(b) by 216 days.

(21) Appl. No.: 18/074,008

(22) Filed: Dec. 2, 2022

(65) Prior Publication Data

US 2023/0196649 A1  Jun. 22, 2023

Related U.S. Application Data

(60) Provisional application No. 63/318,745, filed on Mar. 10, 2022, provisional application No. 63/290,994, filed on Dec. 17, 2021.

(51) Int. Cl.

| | |
|---|---|
| *G06T 15/60* | (2006.01) |
| *G06T 7/507* | (2017.01) |
| *G06T 7/70* | (2017.01) |
| *G06T 13/40* | (2011.01) |
| *G06T 15/20* | (2011.01) |
| *G06T 17/20* | (2006.01) |
| *G06T 19/20* | (2011.01) |

(52) U.S. Cl.
CPC ................ *G06T 19/20* (2013.01); *G06T 7/70* (2017.01); *G06T 13/40* (2013.01); *G06T 17/20* (2013.01); *G06T 2200/24* (2013.01); *G06T 2207/10028* (2013.01); *G06T 2219/2021* (2013.01)

(58) Field of Classification Search
None
See application file for complete search history.

(56) References Cited

U.S. PATENT DOCUMENTS

| | | | | |
|---|---|---|---|---|
| 3,554,249 | A * | 1/1971 | Arnelo | G06Q 10/043 |
| | | | | 144/357 |
| 4,600,919 | A | 7/1986 | Stern | |
| 5,854,634 | A | 12/1998 | Kroitor | |
| 5,892,691 | A * | 4/1999 | Fowler | G06T 19/20 |
| | | | | 345/619 |
| 6,108,011 | A | 8/2000 | Fowler | |
| 6,204,860 | B1 * | 3/2001 | Singh | G06T 19/20 |
| | | | | 345/420 |

(Continued)

*Primary Examiner* — Jason A Pringle-Parker
(74) *Attorney, Agent, or Firm* — Perkins Coie LLP

(57) ABSTRACT

Disclosed is a method to determine influence of a deformation of a curve on a surface. A processor obtains deformations of the curve and desired deformations of the surface. The processor obtains a first point on the surface and determines the influence of the deformation of the curve on the surface by determining a second point on the curve and iterating over a desired deformation of the surface and a corresponding curve. To iterate, the processor determines a desired position of the first point of the desired deformation, determines a position of the first point based on a position of the second point on the corresponding curve and a parameter indicating the influence, and calculates a difference between the desired position of the first point and the determined position of the first point. Based on the difference, the processor adjusts the parameter, and determines the influence based on the parameter.

20 Claims, 22 Drawing Sheets

(56) References Cited

U.S. PATENT DOCUMENTS

| | | | | |
|---|---|---|---|---|
| 6,256,039 | B1* | 7/2001 | Krishnamurthy | G06T 15/00 345/581 |
| 6,298,155 | B1* | 10/2001 | Mitsunaga | G06T 5/50 382/190 |
| 7,196,702 | B1* | 3/2007 | Lee | G06T 17/30 715/964 |
| 7,236,167 | B2* | 6/2007 | Lee | G06T 17/30 345/420 |
| 8,648,855 | B2* | 2/2014 | Pedersen | G06T 19/00 700/180 |
| 8,970,628 | B1* | 3/2015 | Jensen | G06T 19/20 345/647 |
| 8,988,419 | B2* | 3/2015 | Huang | G06T 17/005 345/419 |
| 11,074,738 | B1 | 7/2021 | Stevenson et al. | |
| 2002/0005856 | A1* | 1/2002 | Sasaki | G06T 17/20 345/606 |
| 2004/0095352 | A1* | 5/2004 | Huang | G06T 17/005 345/473 |
| 2006/0033740 | A1 | 2/2006 | Tooley et al. | |
| 2006/0267978 | A1* | 11/2006 | Litke | G06T 17/20 345/419 |
| 2009/0027396 | A1* | 1/2009 | Frisken | G06T 11/203 345/442 |
| 2009/0179899 | A1* | 7/2009 | Gregory | G06T 13/40 345/473 |
| 2009/0225078 | A1* | 9/2009 | Rossignac | G06T 11/203 345/423 |
| 2014/0198106 | A1 | 7/2014 | Sumner et al. | |

* cited by examiner

| | |
|---|---|
| Vis Index | -1 |
| Color Scale | 1 |
| Bake Vis | Off |
| Threshold | 0 |
| Vtx Index | 0 |
| Def Type | Fiber |
| Bind Index | -1 |
| Dropoff | 5 |
| Dropoff Profile 0 | 0.5 |
| Dropoff Profile 1 | 0.5 |
| Rigid | 0 |
| Dropoff Aux | 1 |
| Dropoff Profile 0Aux | 0.1 |
| Dropoff Profile 1Aux | 0.2 |
| Rigid Aux | 0 |
| Local Param(0) | 0 |
| Local Param(1) | 1.5 |
| Local Param(2) | 0 |
| Local Drop(0) | 3 |
| Local Drop(1) | 1 |
| Local Drop(2) | 1 |
| Local Env(0) | 1 |
| Local Env(1) | 1 |
| Local Env(2) | 1 |
| Convolution | 0 |
| Voronoi | 1 |

Display    Anim
Layers    Options    Help

FIG. 5

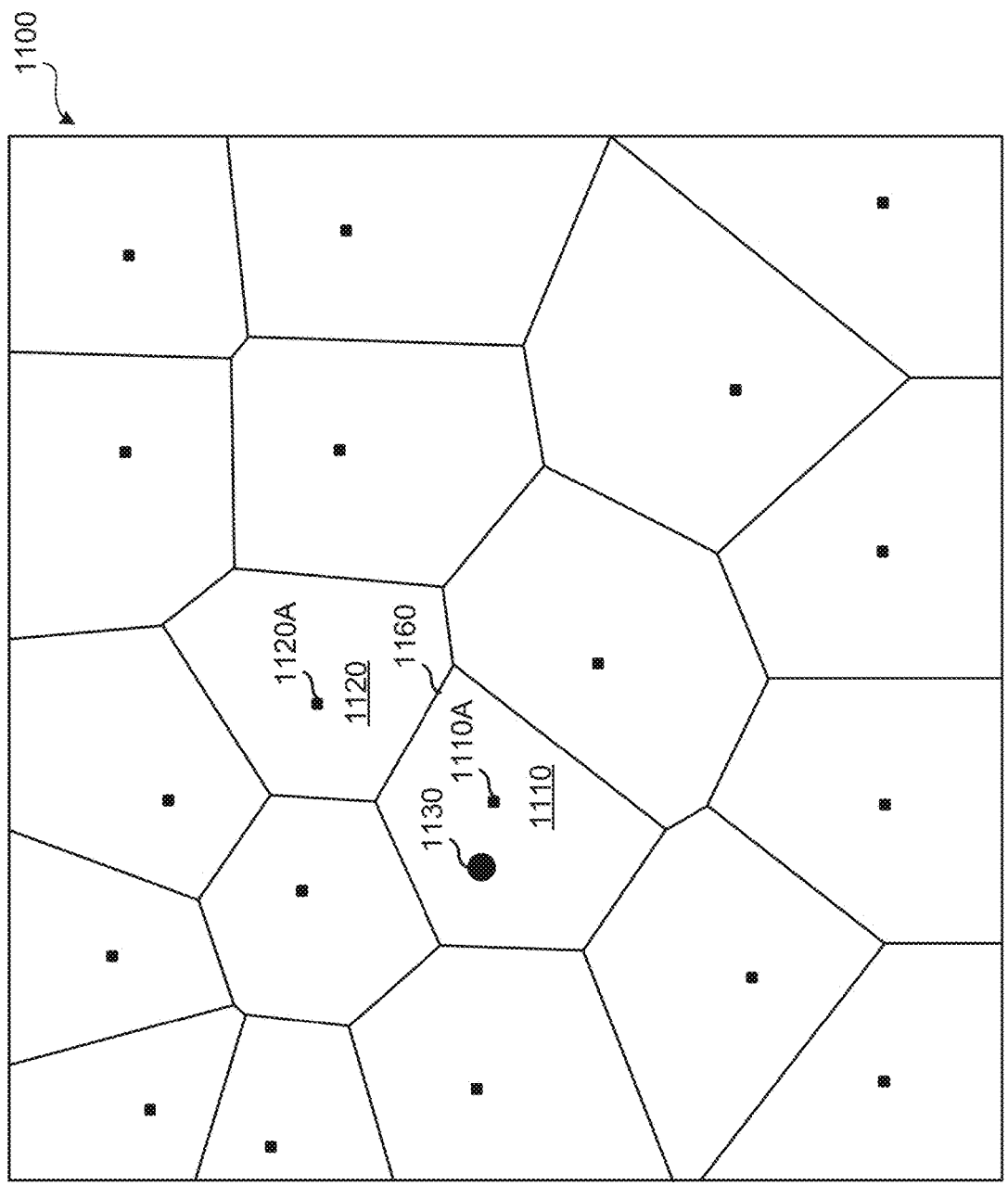

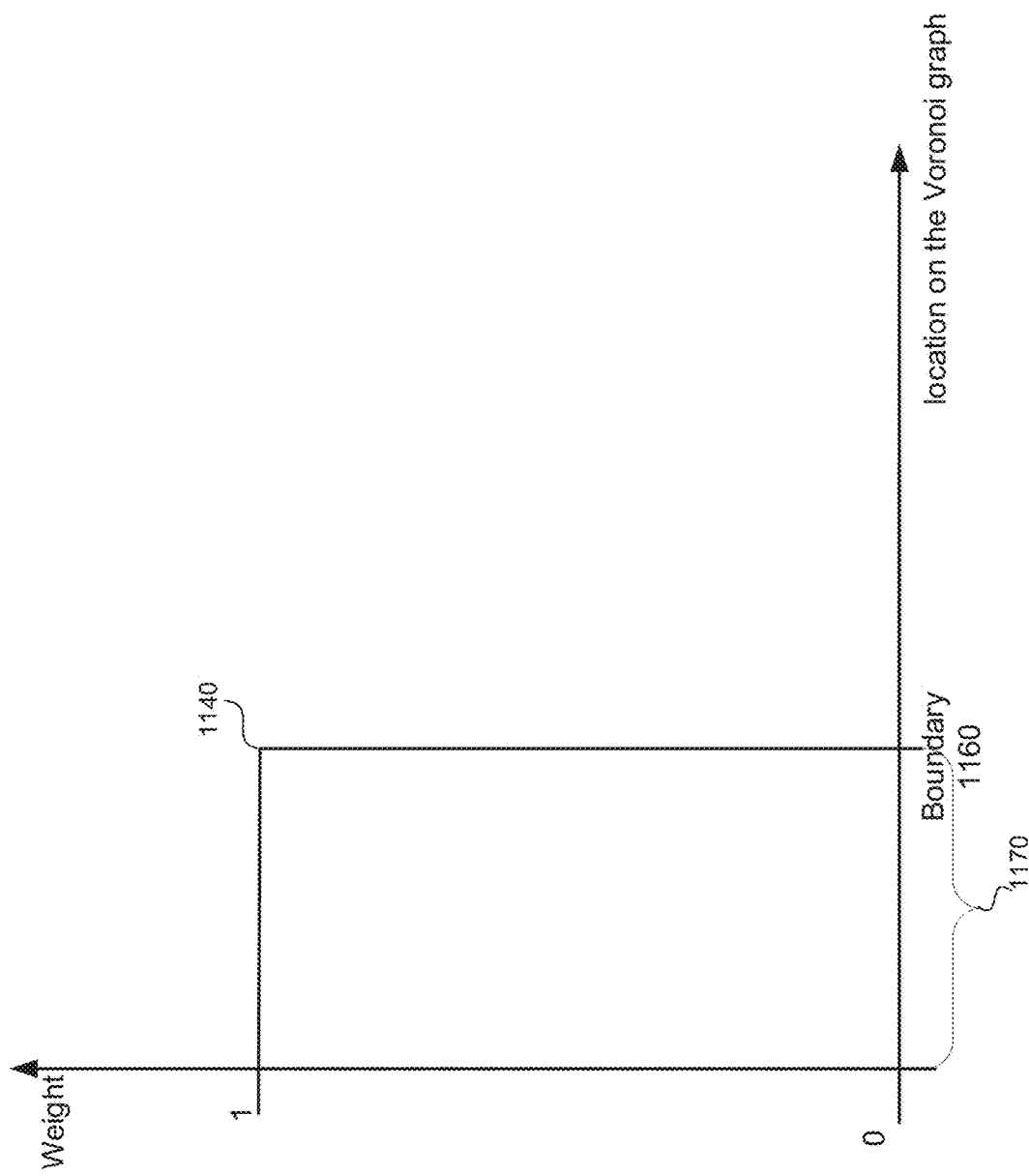

DEFORMING POINTS IN SPACE USING A CURVE DEFORMER

CROSS-REFERENCE TO RELATED APPLICATIONS

This application is a non-provisional of, and claims the benefit of and priority from, U.S. Provisional Patent Application 63/290,994 filed Dec. 17, 2021, entitled "Deforming Points in Space Using a Curve Deformer."

This application is a non-provisional of, and claims the benefit of and priority from, U.S. Provisional Patent Application 63/318,745 filed Mar. 10, 2022, entitled "Object Deformation with Bindings and Deformers Interpolated from Key Poses."

The entire disclosures of the above recited applications are incorporated herein by this reference in their entirety for all purposes.

This application incorporates by reference U.S. patent application Ser. No. 18/061,397 filed Dec. 2, 2022, entitled "Object Deformation with Bindings and Deformers Interpolated from Key Poses."

BACKGROUND

A deformer is an operation that takes as input a collection of vertices and generates new coordinates for those vertices (the deformed coordinates). In addition, new normals and tangents can also be generated. A very simple example would be a translation. A translation deformer takes an input coordinate and returns a translated coordinate. Most deformers have controls—user-defined parameters that give the deformer some variation. In most cases, controls can be animated. A wave deformer has amplitude and phase controls. A lattice deformer has lattice control points. The deformer is an operation that can be applied to a two-dimensional (2D) or three-dimensional (3D) object to adjust the shape of the object. The deformer can be used in 2D or 3D computer animation.

SUMMARY

Disclosed is a method to deform points in space using a curve. A processor obtains the curve and a point on the curve. The processor computes a tangent to the curve at the point and determines a first vector different from the tangent to the curve. The processor constructs a plane at the point on the curve based on the tangent and the first vector. The processor defines the first and second side of the curve, where the first and second side include a first and second set of points on opposite sides of the plane, respectively. The processor defines a deformation associated with the curve and influencing the points in space, where a magnitude of the deformation affecting a second point among the points in space depends on whether the second point is on the first or second side. The processor applies the deformation to the second point.

Also disclosed is a method to determine an influence of a curve deformer, e.g. deformation of a curve, on a surface. A processor obtains deformations of the curve and desired deformations of the surface. The processor obtains a first point on the surface, and determines the influence of the deformation of the curve on the surface by determining a second point on the curve, and iterating over a desired deformation of the surface and a corresponding curve. To iterate, the processor determines a desired position of the first point of the desired deformation, determines a position of the first point based on a position of the second point on the corresponding curve and a parameter indicating the influence, and calculates a difference between the desired position of the first point and the calculated position of the first point. Based on the difference, the processor adjusts the parameter, and determines the influence based on the parameter.

The disclosed deformers, including the curve deformer, can be used in various stages of a computer graphics pipeline such as to sculpt, articulate, animate, simulate, etc. 2D or 3D geometry. For example, in animation, a curve deformer influencing a shape of the mouth can change the shape of the mouth from a frowning expression to a smiling expression. To change the shape of the mouth, an animator can adjust the deformer's attributes, such as interpolate between a frowning shape and a smiling shape. To create an animation, the animator can adjust interpolation between the frowning shape and the smiling shape over a period of time. Based on the animator input and the deformer, the system can generate an animation of a smile.

BRIEF DESCRIPTION OF THE DRAWINGS

Detailed descriptions of implementations of the present invention will be described and explained through the use of the accompanying drawings.

FIG. 5 shows various parameters associated with a wire deformer.

FIG. 11A shows a Voronoi diagram that can be used in Voronoi-based interpolation.

FIG. 11B shows a step function that can be applied to interpolating the weights.

Figure 1:
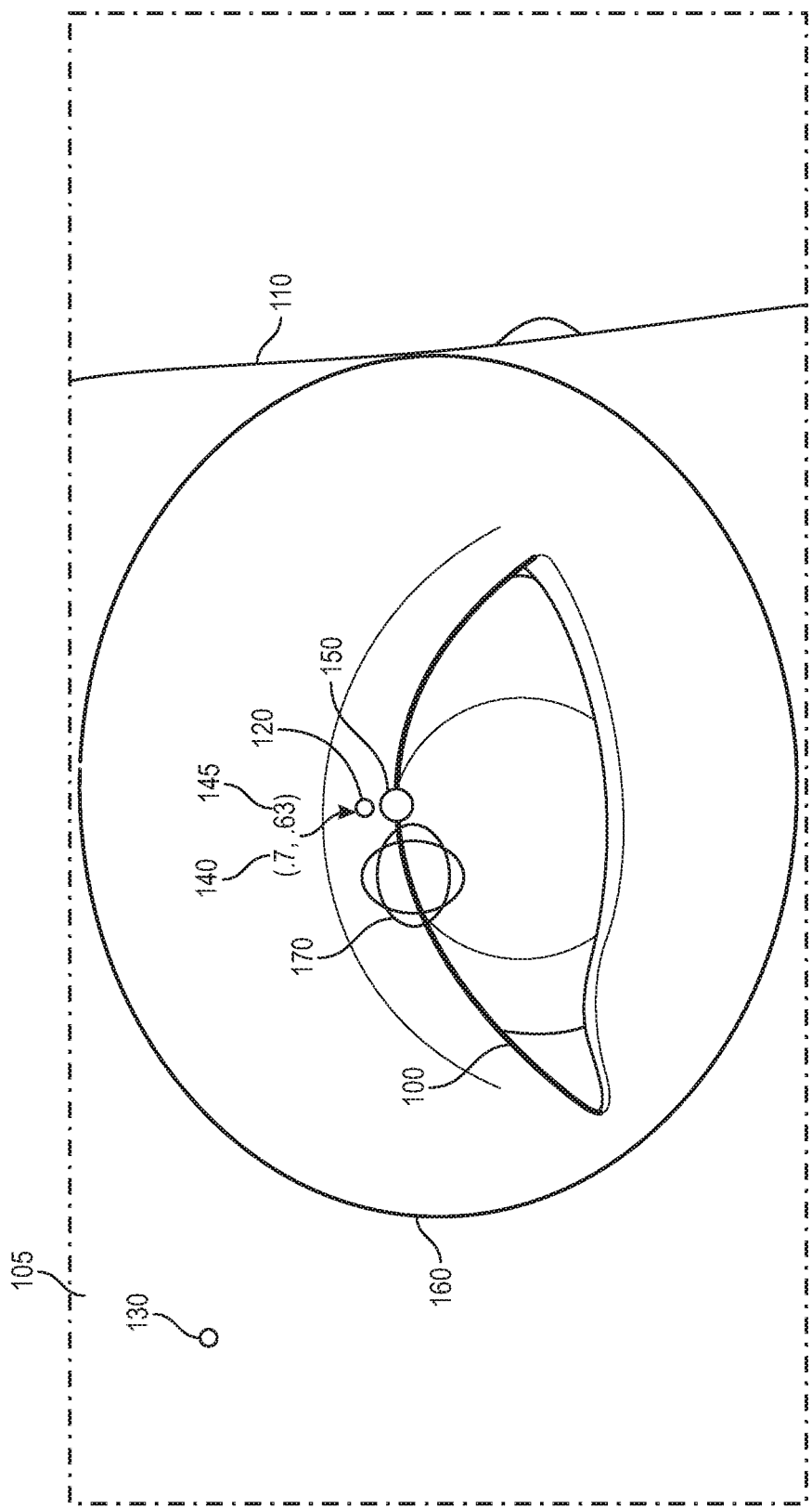
FIG. 1 shows a curve deformer and an object.

The technologies described herein will become more apparent to those skilled in the art from studying the Detailed Description in conjunction with the drawings. Embodiments or implementations describing aspects of the invention are illustrated by way of example, and the same references can indicate similar elements. While the drawings depict various implementations for the purpose of illustration, those skilled in the art will recognize that alternative implementations can be employed without departing from the principles of the present technologies. Accordingly, while specific implementations are shown in the drawings, the technology is amenable to various modifications.

DETAILED DESCRIPTION

A curve deformer, or a wire deformer, uses one or more curves to deform multiple points in space. The multiple points and space can belong to a two-dimensional or a three-dimensional (3D) object. The one or more curves can be deformation handles used by specified parameters of the deformation. Below we describe a wire deformer with many novel contributions on binding behavior of individual curves, fitting wire deformation parameters to a set of curve-object examples, the combination of multiple curves in controlling the deformation of a point and a multi-pose formulation. Note that while the entire formulation below is defined for a 3D object, the curve deformer is equally applicable as a 2D deformer for 2D applications, or a higher dimensional deformer, such as a 4D or a 5D deformer.

The description and associated drawings are illustrative examples and are not to be construed as limiting. This disclosure provides certain details for a thorough understanding and enabling description of these examples. One skilled in the relevant technology will understand, however, that the invention can be practiced without many of these details. Likewise, one skilled in the relevant technology will understand that the invention can include well-known structures or features that are not shown or described in detail, to avoid unnecessarily obscuring the descriptions of examples.

FIG. 1 shows a curve deformer and an object. The curve deformer 170 first binds an object M 105 to a set of parametric 3D curves $\{c_1, c_2, \ldots, c_k\}$ 100 (only one shown in FIG. 1) in a pose b. Pose b in FIG. 1 is an open eyelid. In other words, each point $p^b$ 120, 130 on the object $M^b$ 110 (i.e., object 105 in pose b, is associated with each curve $c_i^b$). Association in this context computes a weight $wt_i^b$ 140 and parameter value $pr_i^b$ 145 for the closest point 150 on $c_i^b$ 100 to point $p^b$ 120 (i.e., $c_i^b(pr_i^b)$ 150 is the closest point on the curve to point $p^b$). The weight $wt_i^b$ is an influence weight that falls off radially from 1 on the curve to 0 at some dropoff distance $dr_i$. Formally, $wt_i^b = f(\max(1, \|c_i^b(pr_i^b) - p^b\|/dr_i))$. $f(x):[0,1] \rightarrow [0,1]$ is typically a bell shaped sigmoid function, such as $(x^2-1)^2$, such that $f(0)=1$ and $f(1)=f'(0)=f'(1)=0$.

For example, points in region 160 have a non-zero weight, while the remainder of the points on the object 110 have a zero weight. In other words, only the points in the region 160 deform when the curve 100 is deformed. For example, point 120 changes position as shown in FIGS. 2A-2B, while point 130 stays in the same position as shown in FIGS. 2A-2B.

Figure 2A:
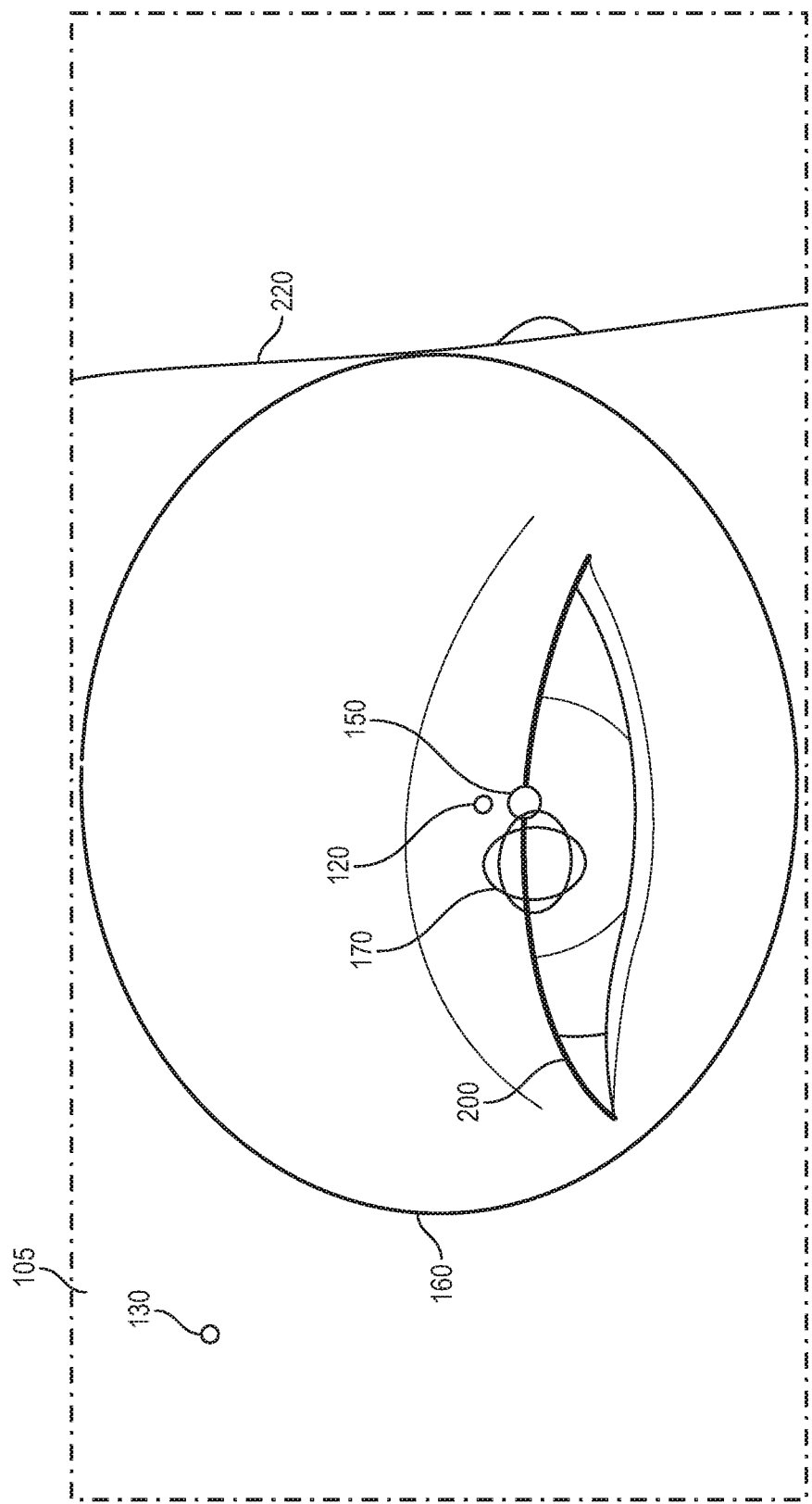
FIGS. 2A-2B show the deformation of the object along with the deformation of the curve.
Figure 2B:
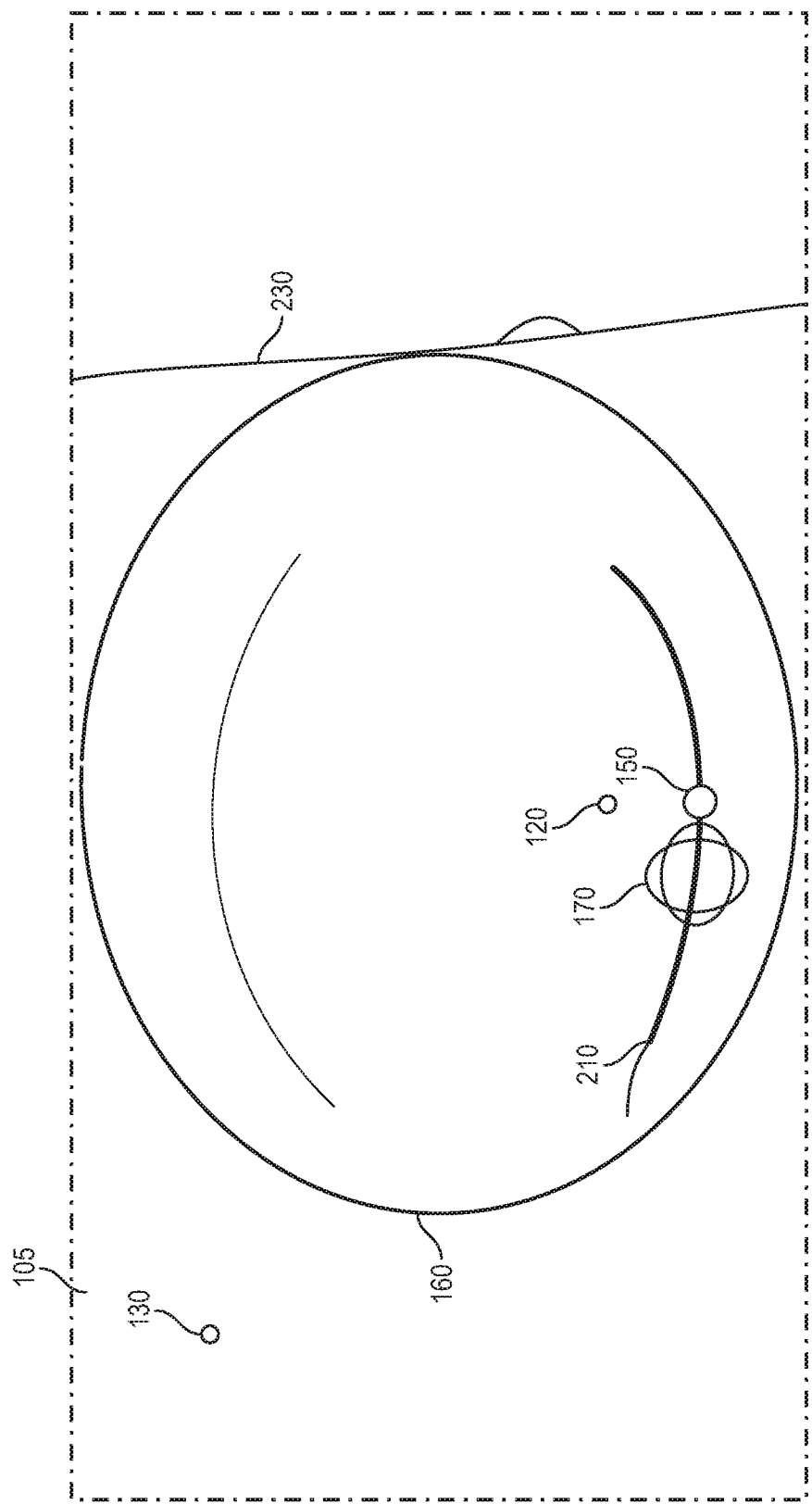

FIGS. 2A-2B show the deformation of the object 110 along with the deformation of the curve 100. Subsequent to binding, when the curve 100 is now manipulated to position $c_i^l$ 200, 210 as part of a pose l 220, 230, the deformation induced by curve $c_i^l$ 200, 210 is $(L(pr_i^b) B(pr_i^b)^{-1})^{wt_i^b}(p^b)$. B and L are local 4×4 frame of reference transform matrices at pose b and l on the curve at parameter $pr_i^b$. From the above, it is clear that for $wt_i^b = 0$ or when $L=B$, the point $p^b$ remains undeformed. In the simplest setting, B and L are local origin translations, and the above formulation is simply $p^b + wt_i^b * (c_i^l(pr_i^b) - c_i^b(pr_i^b))$.

If there are multiple curves 100, the deformed contribution of each curve can then be combined in a number of ways in the original formulation ranging from a simple cumulative deformation to one that is weighted by the magnitude of deformation.

As can be seen in FIGS. 2A-2B, the points in the region 160 move along with the curve 200, 210, while the remainder of the points on the object 105 remain unaffected.

As can be seen in FIGS. 1, 2A-2B, the curve deformer 170 can adjust the shape of the object 110 in FIG. 1, 220 in FIG. 2A, 230 in FIG. 2B as the shape of the curve 100 changes to shapes 200, 210 in FIGS. 2A-2B, respectively.

Sided Fall-Off Function

Figure 3:
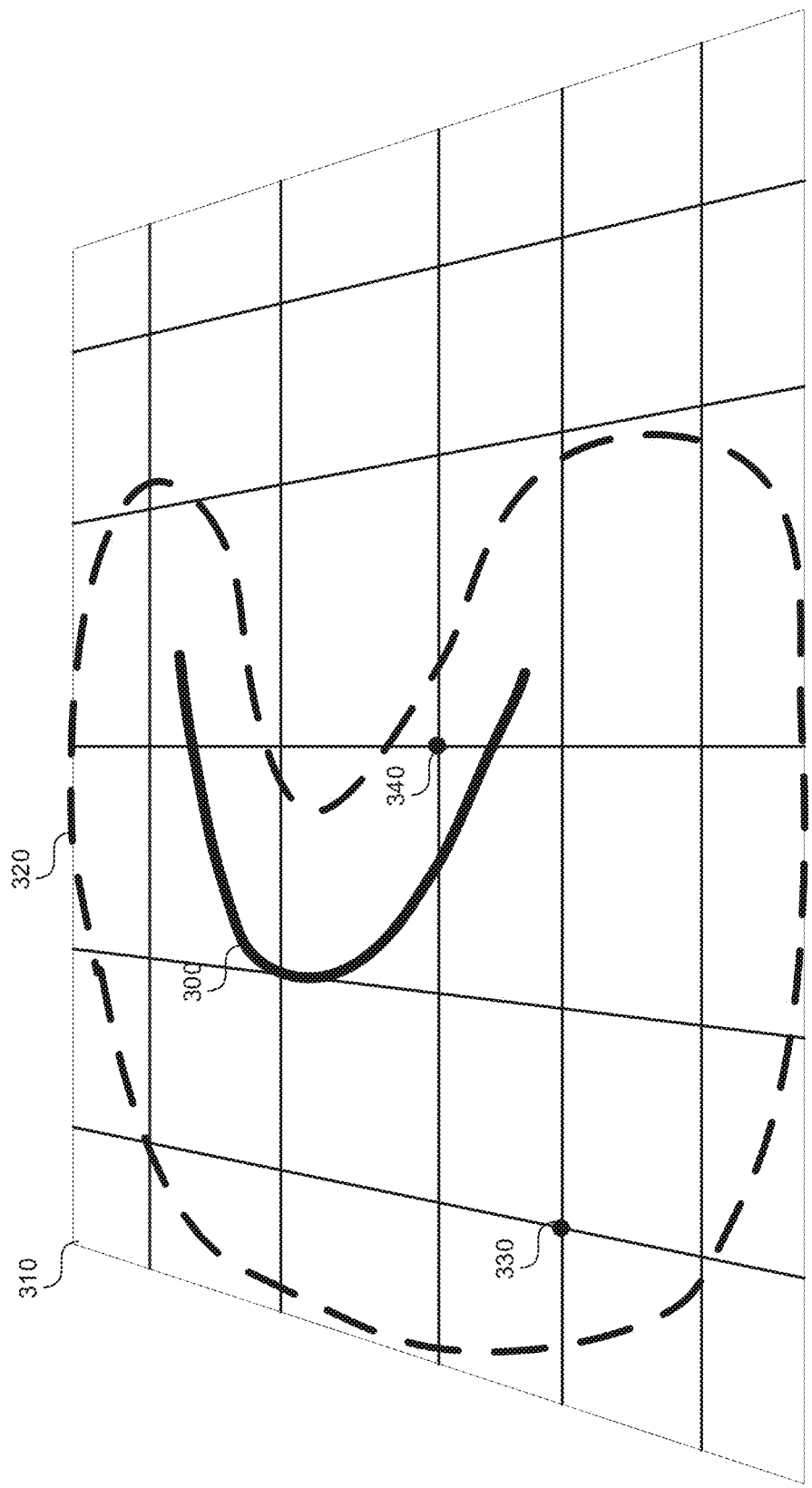
FIG. 3 shows binding of a curve to the object.
Figure 4:
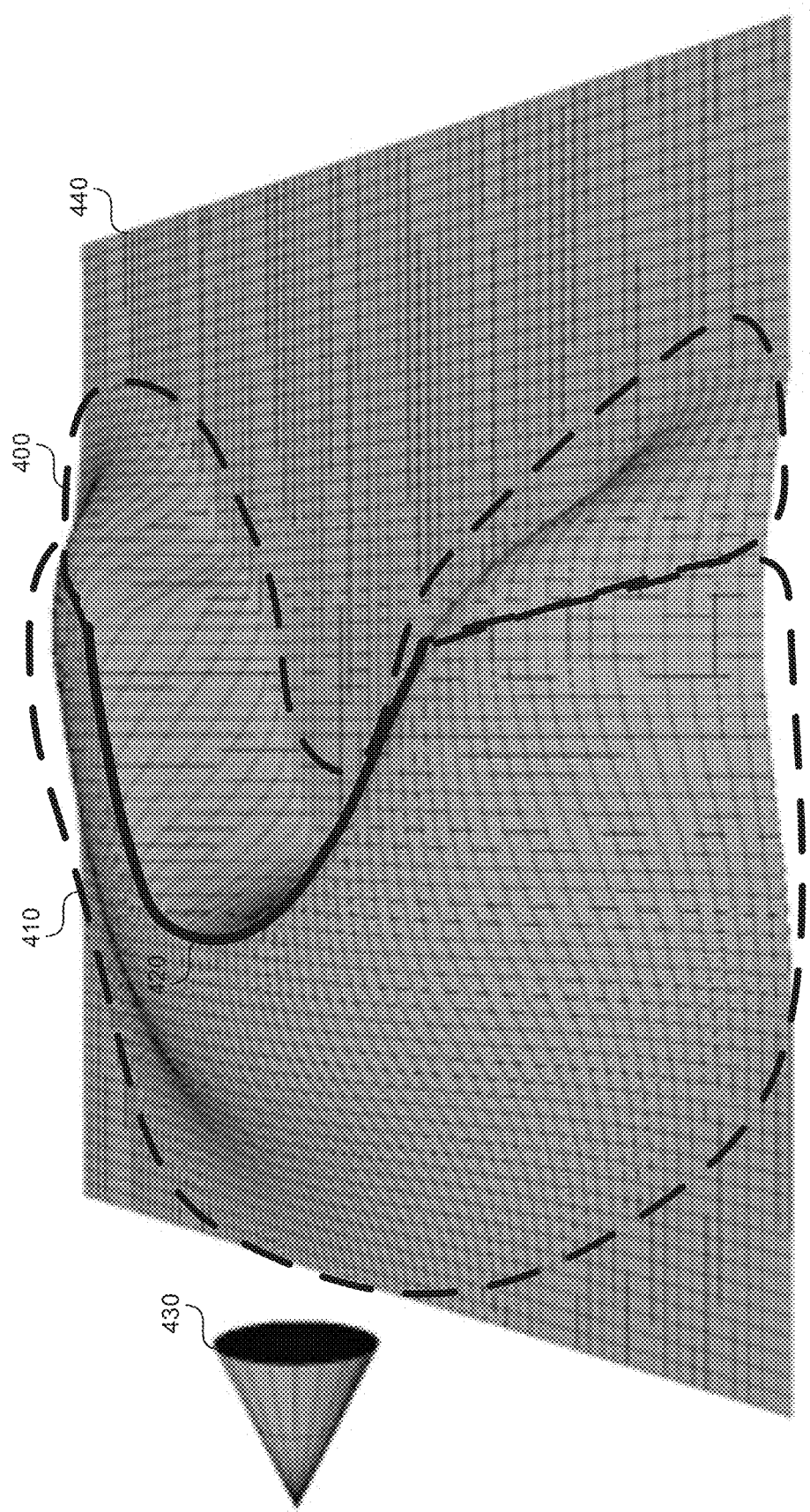
FIG. 4 shows an asymmetric deformation varying with sidedness of a curve.

FIG. 3 shows binding of a curve 300 to the object 310. The curve 300 can be bound to the object 310 in the pose shown in FIG. 3. The object 310 is a plane, and the curve 300 can be a planar curve lying on the object 310. The points 330, 340 (only two labeled for brevity) in the region 320 are affected by deformation of the curve 300. In other words, the points 330, 340 in the region 320 have a non-zero deformation weight. After binding, the curve 300 can be translated upwards, as shown in FIG. 4. When the curve 300 is deformed (i.e., translated), the points 330, 340 in the region 320 are deformed according to various parameters. The points, as shown in FIG. 4, can be asymmetrically deformed.

FIG. 4 shows an asymmetric deformation varying with sidedness of a curve. As can be seen in FIG. 4, points on one side 400 of the curve 420, have a different deformation than the points of the other side 410 of the curve. The points on one side 400 of the curve 420, have a sharper dropoff than the points on the other side 410 of the curve 420.

The sidedness vector is shown by the cone 430 orientation at its origin. The cone orientation indicates the left and right side of the curve 420, and how to deform the points of the plane 440. The sharpness of the drop-off depends on the parameters of the deformer. The parameters of a deformer can be specified by the user.

FIG. 5 shows various parameters associated with a wire deformer. The parameter Dropoff 500 defines that dr0=5, and parameter DropoffAux 510 defines that dr1=1. The two parameters 500, 510 produce a gradual fall-off on one side and a quick fall-off on the other with smoothly interpolated behavior in-between.

Figure 6:
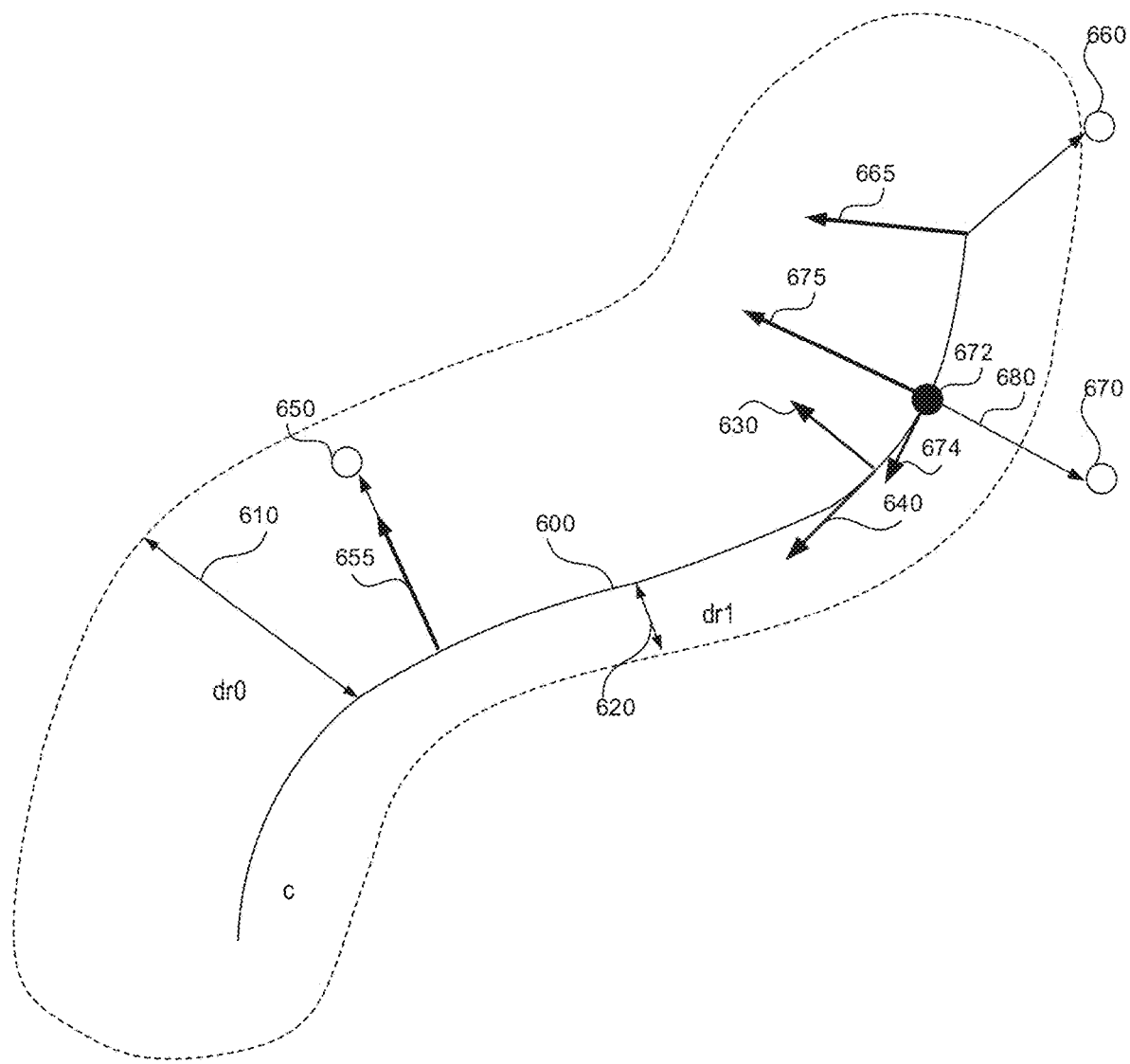
FIG. 6 shows a process to determine sidedness of a curve.

FIG. 6 shows a process to determine sidedness of a curve. As can be seen in FIGS. 4 and 6, a design goal is to have a different deformation fall-off on either side of a curve 600. While a side, at least in a local neighborhood around a wire curve, can be readily defined for curves that are embedded in the surface of an object, such a notion by itself is ambiguous in 3D for a curve that is not attached to a surface.

A local plane formed by an up vector 630 and the tangent 640 to the wire curve 600 can define a meaningful half-space or side with which to compute a sided fall-off. In one embodiment up 630, can be the surface normal on the object at point p 650, 660, 670. In another embodiment up can be based on the bi-normal direction of a Frenet frame defined using local tangent direction c'(pr), local curvature direction c"(pr) and the bi-normal or up=c'(pr)× c"(pr). In yet another embodiment, up 630 can be user-defined for the entire curve, or user-defined at discrete points on the curve, from which the up vector 630 can be parametrically interpolated.

Typically, the fall-off distance dr 610, 620 for a curve c is a radially symmetric distance around the curve 600. The deformation weight wt for a point p 650, 660, 670, as aforementioned is:

$$wt = f(\max(1, \|c(pr) - p\|/dr)).$$

A processor can define a sided fall-off by using two different fall-off distances dr0 610, dr1 620. The processor can then compute a vector, s, 655, 665, 675 to capture sidedness for a point p 650, 660, 670, respectively, as $$s = \text{normalize}(c'(pr) \times up),$$

where c'(pr) is the tangent to the curve c at the closest point parameter pr, and up, the up vector.

For example, point 672 is the closest point parameter pr for the point 670. Vector 674 is the tangent to the curve c 600 at the point 672. The sidedness vector s 675 is the cross product of the tangent 674 and the up vector 630. As can be seen in FIG. 6, all sidedness vectors 655, 665, 675 point in the same direction.

To determine the sidedness of a point p 650, 660, 670, the processor performs the below calculation. The processor can compute the angle between vector p−c(pr) 680 (only one labeled for brevity) and s 675. In one embodiment, the processor can define this angle using a dot product $$ss = s \cdot \text{normalize}(p - c(pr)),$$

where both s and normalize(p−c(pr)) are unit vectors. A dot product returns a value of 1 when the two unit vectors are parallel, a value of 0 when the two unit vectors are perpendicular, and the value of −1 when the two unit vectors point in opposite directions. For point 670, the dot product of vector 680 and vector 675 is −1. For point 650, the dot product of the corresponding two vectors is 1. Therefore, one side of the curve 600 corresponds to a dot product between 0 and −1, and the other side of the curve corresponds to a dot product between 0 and 1.

To create a smooth transition between the two sides of the curve, the processor can set the fall-off to be dr0 if ss>threshold0, and similarly to dr1 if ss<−threshold0. For values of ss between −threshold0 and threshold0, the processor can return an interpolated fall-off between dr1 and dr0. The default threshold can be 0.5, representing an angle difference of up to 60°.

Figure 7B:
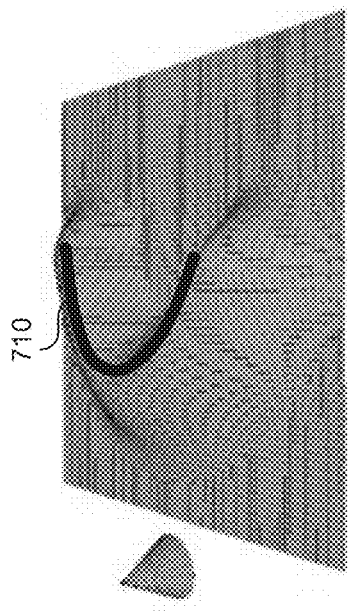
FIGS. 7A-7D show how rotating of the up vector affects the sidedness direction.
Figure 7D:
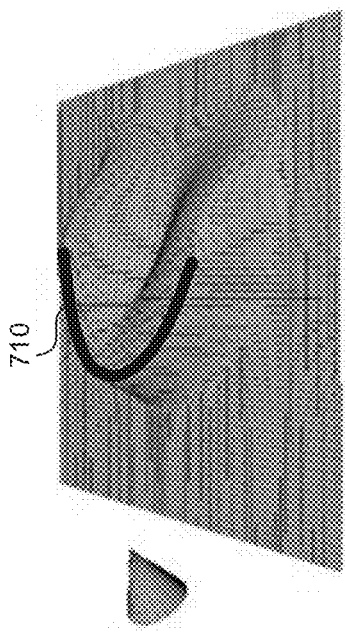
Figure 7A:
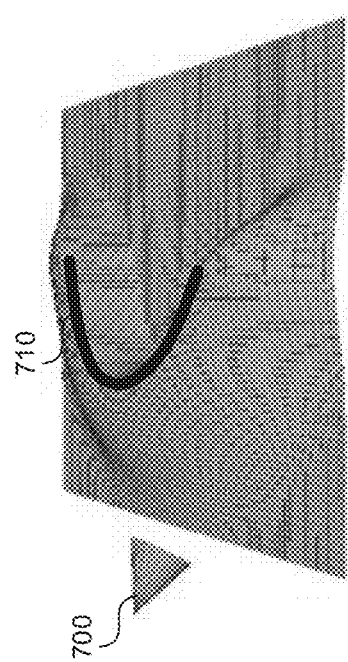
Figure 7C:
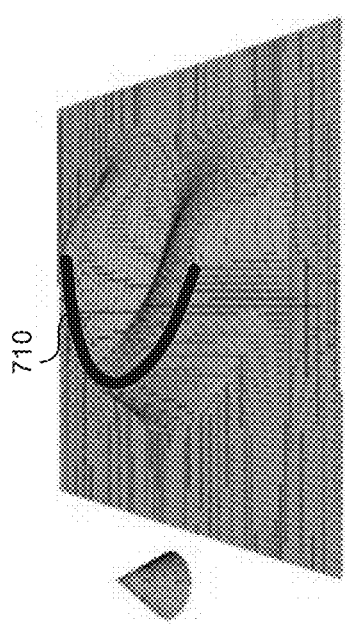

FIGS. 7A-7D show how rotating of the up vector affects the sidedness direction. The rotation of the apex of the cone 700 indicates rotation of the up vector. As explained above, rotation of the up vector affects the determination of the sidedness of the curve 710. As the cone 700 and the up vector rotate, the fall-off parameters, Dropoff 500 in FIG. 5 dr0=5 and DropoffAux 510 in FIG. 5 dr1=1, change sides as the cone rotates from dr0, mapping to the outside of the C-shape as seen in FIG. 7A, to controlling the inside of the C-Shape as seen in FIG. 7D.

Figure 8:
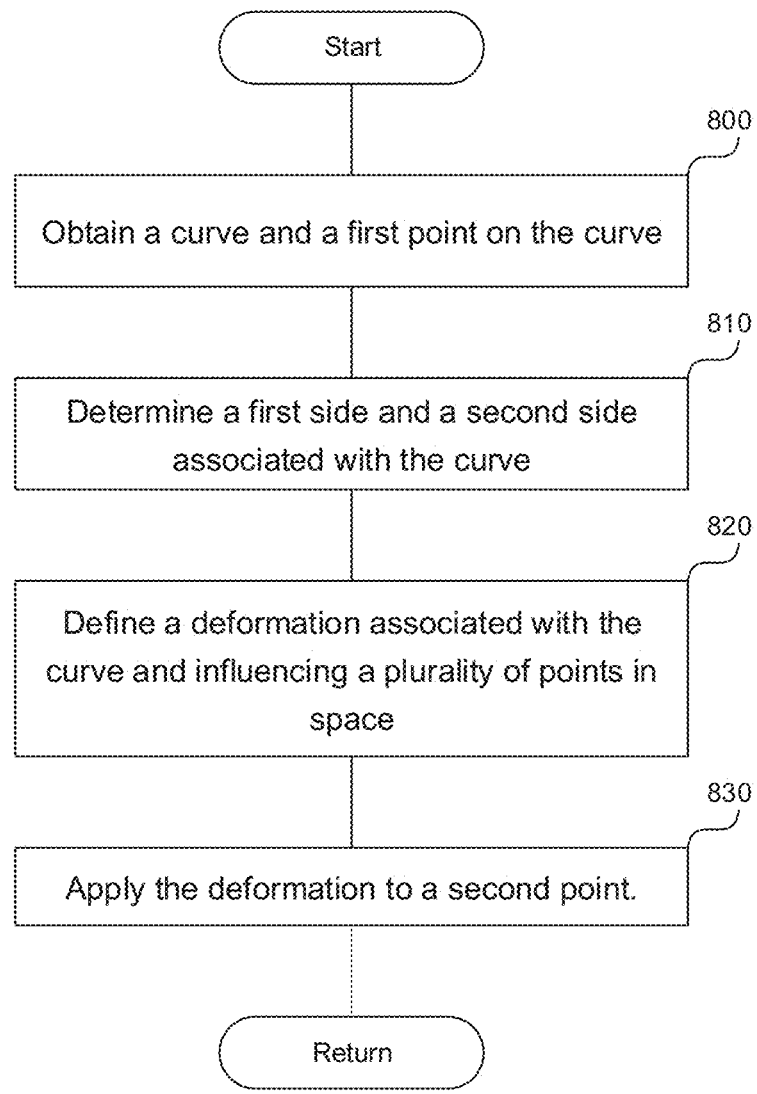
FIG. 8 is a flowchart of a method to deform points in space using a curve.

FIG. 8 is a flowchart of a method to deform points in space using a curve. In step 800, a hardware or software processor executing instructions described in this application can obtain the curve and a first point on the curve.

In step 810, the processor can determine a first side and a second side associated with the curve. To determine sidedness of the curve, the processor can compute a tangent to the curve at the first point, determine a first vector, for example, an up vector, different from the tangent to the curve, and construct a plane at the first point on the curve based on the tangent and the first vector. Based on the plane, the processor can define the first side associated with the curve and the second side associated with the curve. Specifically, the first side associated with the curve can include a first set of points on one side of the plane, and the second side can include a second set of points on another side of the plane.

In one implementation, to determine the first vector, the processor can determine that the first vector is the surface normal on a surface at the first point. Specifically, the processor can determine a surface associated with the curve, where the curve lies on the surface, and the first point lies on the surface. The processor can determine the first vector by calculating a normal of the surface at the first point.

In another implementation, to determine the first vector, the processor can determine that the first lecture is the binormal direction of a Frenet-Serret frame associated with the curve at the first point. The processor can compute T, the unit vector tangent to the curve. The processor can compute N, the normal unit vector, to be the derivative of T with respect to the arclength parameter of the curve, divided by its length. Finally, the processor can compute the binormal direction of a Frenet-Serret frame by computing the cross product of T and N.

In a third implementation, to determine the first vector, the processor can obtain a user-defined first vector over the entire curve, or the processor can obtain a user-defined first vector over certain points on the curve, from which the processor can interpolate the first vector. Specifically, the processor can obtain a third vector defined at a third point on the curve and a fourth vector defined at a fourth point on the curve, where the third point and the fourth point are different from the first point. The processor can interpolate the third vector and the fourth vector to obtain the first vector.

In step 820, the processor can define a deformation associated with the curve and influencing the points in space, where a magnitude of the deformation affecting a second point among the set of points in space depends on whether the second point is associated with the first side or the second side associated with the curve.

In one implementation, to define the deformation, the processor can obtain a first magnitude of deformation associated with the first side, and a second magnitude of deformation associated with the second side, where the first magnitude and the second magnitude are different. The processor can define a first function based on a location of the second point, a distance between the second point and the curve, and the first magnitude of deformation. The processor can define a second function based on the location of the second point, the distance between the second point and the curve, and the second magnitude of deformation. The processor can determine whether the second point is on the first side or the second side associated with the curve. Upon determining that the second point is on the second side associated with the curve, the processor can apply the second function to deform the second point.

In another implementation, to define the deformation, the processor can obtain a first magnitude of deformation associated with the first side, and a second magnitude of deformation associated with the second side. The processor can obtain a first criterion associated with the first side and a second criterion associated with the second side, where points on the first side satisfying the first criterion form a first region, points on the second side satisfying the second criterion form a second region, and points not satisfying the first criterion and the second criterion form a third region. The criterion can include a threshold angle. For example, the points on the first side can be points where the angle between the sidedness vector and vector connecting the point to the curve is between 60° and −60°. The points on the second site can be the points where the angle between the sidedness vector and the vector connecting the points to the curve is between 120° and 240°. The remainder of the points belong to the third region. The processor can define a magnitude of deformation to be the first magnitude in the first region, the second magnitude in the second region, and an interpolation of the first magnitude and the second magnitude in the third region.

In step 830, the processor can apply the deformation to the second point.

Multiple curves can influence the same point. To determine the cumulative deformation, the processor can obtain a second curve configured to deform the points in space, where the second curve deforms the second point. The processor can obtain a first magnitude of deformation associated with the curve and a second magnitude of deformation associated with the second curve. The processor can deform the second point in proportion to an exponent of the first magnitude and an exponent of the second magnitude. The exponent can include a square of the first magnitude and the second magnitude, a cube of the first magnitude and the second magnitude, etc.

Data-Driven Fitting of Wire Parameters

Figure 9:
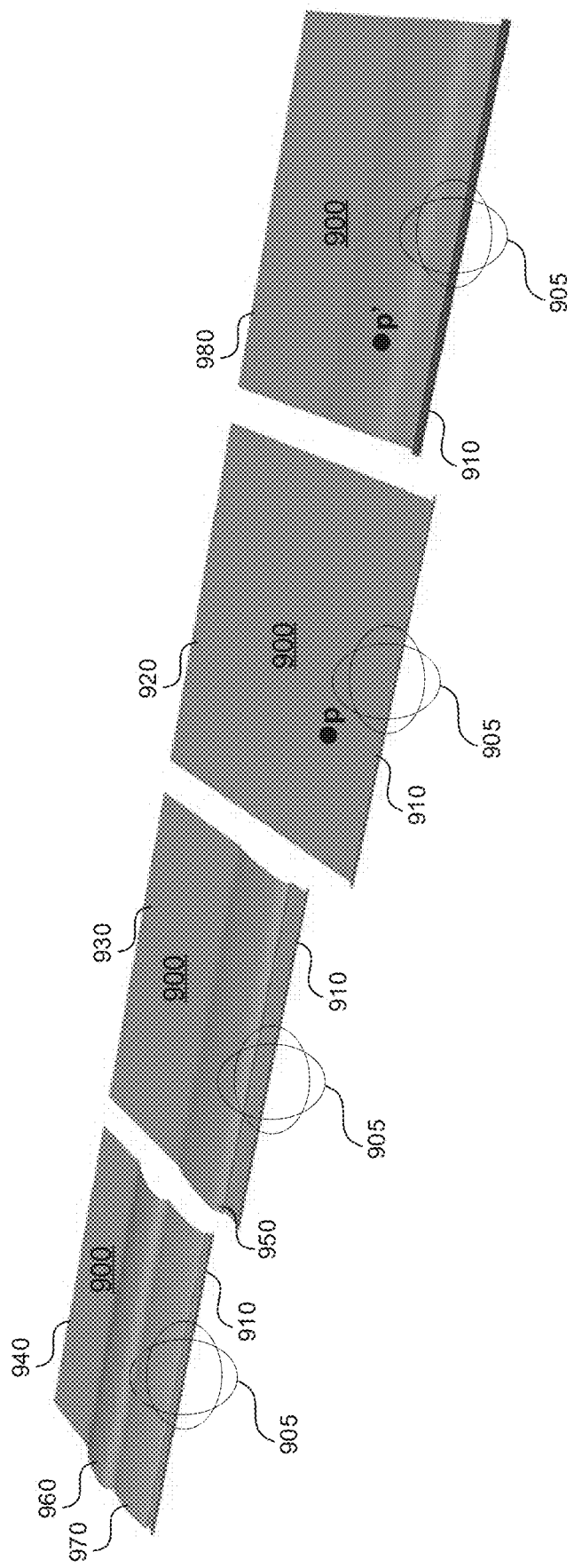
FIG. 9 shows a binding pose, multiple sculpt poses, and deforming of an object using a curve deformer.

FIG. 9 shows a binding pose, multiple sculpt poses, and deforming of an object using a curve deformer. The curve deformer 905 includes the curve 910. An object 900 can be bound to the curve 910 in pose 920. The curve 910 can be referred to as a wire, a polyline, a line, etc. The relative change of the curve 910 from its bound state shown in pose 920 is then used to define a deformation of the object 900 geometry. Typically, deformers provide good deformation quality and user control when the curve 910 is spatially close to its bound state. However, deformation degrades with increasing deviation of the curve 910 from the bound state 920.

To address this problem, a user can sculpt the geometry of the object 900 manually to a desired form in a problematic pose. The multiple sculpt poses 930, 940 provide the desired shape. For example, the wrinkling 950, 960, 970 of the object 900 is specified by the user and does not occur by simply binding the object 900 to the curve 910 in pose 920.

The pose 980 is a deformation obtained by moving the curve 910. The curve 910 is in a position different from the position in poses 920, 930, 940, and the object 900 assumes a position that is a weighted average of the poses 920, 930, 940.

For a single artist-placed curve 910 and a single point p on the object, let the desired deformation be p' resulting from a change in the closest point on the wire $p'=(\delta C(pr))\hat{}wt(p)$.

In the simplest embodiment, $p'-p=\delta p=\delta c(pr)*wt$. Computing the best-fit weight, wt, for a point over a large number of sculpt pose data 920, 930, 940 sample pairs $\delta p^i$, $\delta c^i=$, is tantamount to minimizing $\Sigma^{n_{j=1}}\|\delta p^i-\delta c^i(pr)*wt\|^2$, which yields $wt=\Sigma^{n_{j=1}}\delta p^i \cdot \delta c^i(pr)/\Sigma^{n_{j=1}}\delta c^i(pr) \cdot \delta c^i(pr)$. This weight can further be used to define wire parameters such as a fall-off distance dr by inverting the fall-off function for the point. For example, if $wt=f(\max(1, \|c^b(pr)-p\|/dr))$, and $f(x)$ is $f=(x^2-1)^2$, for wt>0, $dr=\|c^b(pr)-p\|/\sqrt{(1-\sqrt{wt})}$, and $dr<=\|c^b(pr)-p\|$, for wt=0.

In one implementation, a processor can obtain a single fall-off distance as a constrained average dr as above for all points of the object. In another implementation, the processor can use the best-fit weights as-is without the need for a precise fall-off distance. In the case where weights are used as-is, the processor can smooth the weights by averaging the weights over neighboring points on the object. A simple example of such smoothing can be iterative Laplacian smoothing, where in each iteration (typically 3-5 iterations) the weight wt of a point p, is adjusted towards (say by a fraction a, for eg. a=0.2) the average of its neighboring points, i.e. wt=wt*(1−a)+a*nbr_wt_average(p). For a mesh, neighbors of p, nbrs(p) are the set of vertices connected to p by edges. nbr_wt_average(p)=($\Sigma$q in nbrs(p) wtq)/|nbrs(p)|. For a point-cloud the neighborhood of p could be simply other points within a distance threshold to p. A person of ordinary skill in the art would appreciate that any of a number of approaches to locally smoothing the weight values could be used.

Such data-fitting approaches can help minimize the displacement between sculpted poses and the default deformation produced by wires. Note also that object deformation is typically the weighted cumulative result of several wire curves (or deformation handles in general). In other words, a deformed point $p'=\Sigma^{n_{j=1}}w^j*(L(pr^{bj})B(pr^{bj})^{-1})\hat{}wt^{bj}(p^b)$, where j indicates the wire curve $c_j$. As multiple wire curves often control the same point, $vw^j$ can be a normalized weight for point p that captures $c_j$'s contribution relative to other curves. In one embodiment, this weight $w^j$ can be based on the spatial proximity of the wire curves to the point p; for example, $w^j=1/(1+k*\|c^b(pr)-p\|^2)$, is a function that returns $w^j=1$ when the distance between the point and curve is 0, and decays in weight towards 0 with increasing distance between the point and curve; these weights can then be normalized by dividing each weight by $\Sigma^{n_{j=1}}w^j$.

Typically, there will be a set of points on the object influenced by a single wire curve. The processor can use these points to establish the fall-off parameters for these curves. Then, given these parameters and weights, the constant k can be computed to best fit the wires to points that are influenced by multiple curves.

In addition to, or instead of, determining weights, the processor can determine other deformer parameters that are not fixed by the user. For example, the processor can use the above-described process to determine deformer parameters such as the drop-off parameter, dr0, dr1, which can be asymmetric.

In addition to, or instead of, deforming geometry, the curve deformer 905 can be used to deform, or interpolate, color, texture, UV maps, shading parameters, etc. UV mapping is the 3D modeling process of projecting a 2D image to a 3D model's surface for texture mapping. The letters "U" and "V" denote the axes of the 2D texture because "X", "Y", and "Z" are already used to denote the axes of the 3D object in model space. For example, when the wire deformer expands a geometry of a face, the deformer can also increase the shine of the face because skin becomes shinier as it expands.

Figure 10:
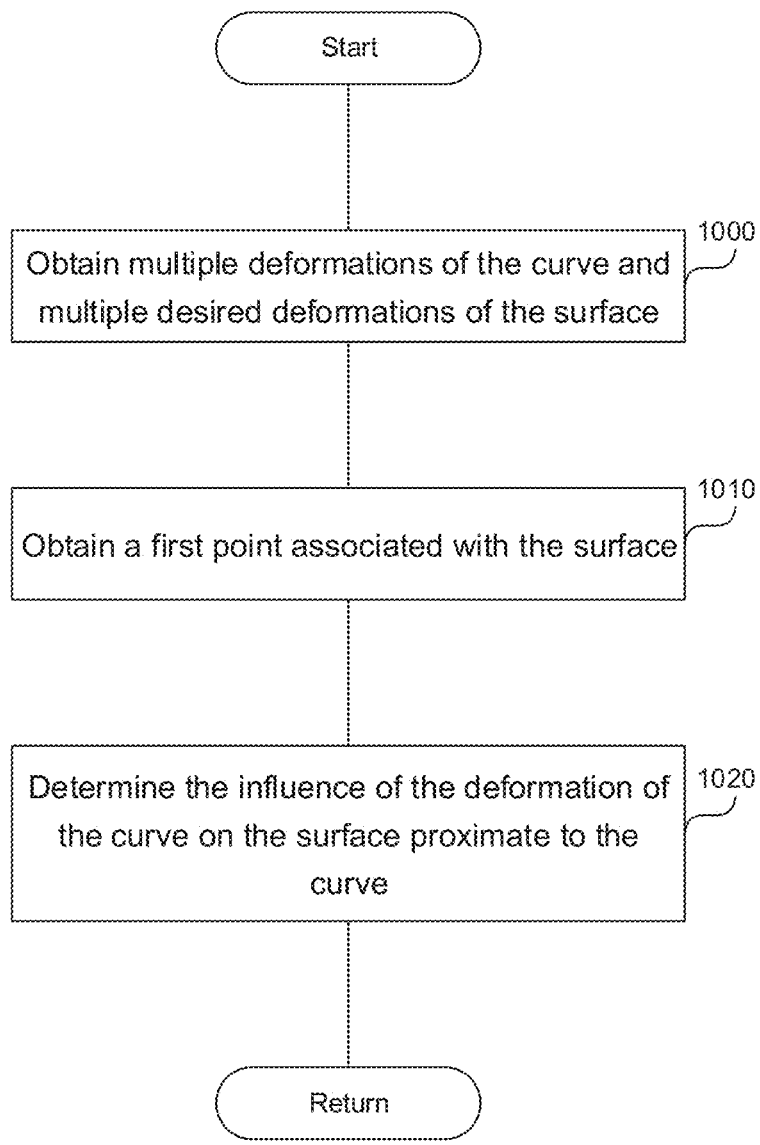
FIG. 10 is a flowchart of a method to determine an influence of a deformation of a curve on a surface proximate to the curve.

FIG. 10 is a flowchart of a method to determine an influence of a deformation of a curve on a surface proximate to the curve. The surface can include a surface of a two-dimensional object, a surface of the three-dimensional object, a surface of a four-dimensional object, etc. In step 1000, a processor can obtain multiple deformations of the curve and multiple desired deformations of the surface. The correspondence between multiple different formations of the curve in the multiple desired deformations of the surface can be 1 to 1. For example, the deformations of the curve in the deformations of the surface can be sculpted by a user. In another example, the deformations of the curve can be sculpted by the user, while the deformations of the surface are obtained from a motion capture system. The deformations of the curve and the surface can be nonrigid. The deformations of the curve and surface can include rest positions of both the curve and the surface.

In step 1010, the processor can obtain a first point associated with the surface. In step 1020, the processor can determine the influence of the deformation of the curve on the surface proximate to the curve. The processor can determine a second point associated with the curve and proximate to the first point. The second point can be a point on the curve that is closest to the first point. The processor can iterate over each desired deformation of the surface among the multiple desired deformations of the surface and a corresponding curve among the multiple deformations of the curve, and perform the following steps. First, the processor can determine a desired position of the first point associated with each desired deformation, and a position of the first point calculated based on a position of the second point associated with the corresponding curve, and a parameter indicating the influence. The processor can calculate a difference between the desired position of the first point and the calculated position of the first point. The parameter can be a variable parameter of the deformer, such as a parameter that has not been fixed at a particular value. The variable parameter can be a parameter that can vary within a predetermined range, or can vary arbitrarily. The deformer parameter can be a weight associated with the deformer, a dropoff associated with the deformer, or other parameters and constant used to compute the weight. Based on the difference, the processor can calculate a total difference. The processor can reduce or minimize the total difference by adjusting the parameter until the total difference between the desired position of the first point and the calculated position on the first point is minimal. The processor can determine the influence based on the parameter.

In one implementation, to determine the influence of the deformation of the curve on the surface, the processor can obtain a third point associated with the surface, where the influence of the deformation of the curve on the third point associated with the surface is undetermined. The processor can determine a distance between the third point associated with the surface and the curve. The processor can determine the influence of the deformation of the curve on the third point based on the distance. The influence can be inversely correlated to the distance.

In another implementation, to determine the influence of the deformation of the curve on the surface, the processor can obtain a third point associated with the surface, where the influence of the deformation of the curve on the third point associated with the surface is undetermined. The processor can obtain multiple points neighboring the third point, and multiple parameters associated with the multiple points. The processor can determine the influence of the deformation of the curve on the third point by averaging the multiple parameters.

In a fourth implementation, to determine the influence of the deformation of the curve on the surface, the processor can determine that the first point is deformed by multiple curves. The processor can determine a first influence of a first curve among the multiple curves associated with the first point by: determining a distance between the first point and the first curve, and calculating the first influence to be inversely correlated to the distance.

In a fifth implementation, to determine the influence of the deformation of the curve on the surface, the processor can determine that the first point is deformed by multiple curves. The processor can create a multidimensional space, where a first dimension in the multidimensional space corresponds to a first curve among the multiple curves. The processor can create a multidimensional Voronoi diagram including multiple Voronoi cells, wherein a center of a Voronoi cell among the multiple Voronoi cells corresponds to the first curve. The processor can determine a location of the first point in the multidimensional space. Based on the location of the first point to the multidimensional space, the processor can determine the Voronoi cell to which the first point belongs. The processor can determine that the first curve associated with the Voronoi cell has a higher influence on the first point than a remainder of the multiple curves.

In addition to, or instead of, deforming the geometry of the surface, the curve deformer can also interpolate between other properties associated with the surface. For example, the processor can obtain multiple attributes associated with the surface, such as a color, a texture, a UV map, or a shading parameter. Based on the deformation of the curve, the processor can interpolate between the multiple attributes associated with the surface.

The curve deformer can interpolate other properties associated with the surface, independent of the geometry. The processor can obtain multiple attributes associated with the surface. The processor can receive an indication of a second influence associated with the deformation of the curve, where the second influence associated with the deformation of the curve changes the multiple attributes, and where the second influence associated with the deformation of the curve is independent of the influence associated with the deformation of the curve. Based on the deformation of the curve and the indication of the second influence, the processor can interpolate between the multiple attributes associated with the surface, independent of the changes to the geometry.

Affinity-Based Interpolation

FIG. 11A shows a Voronoi diagram 1100 that can be used in Voronoi-based interpolation. A Voronoi diagram 1100 includes multiple cells 1110, 1120 (only two labeled for brevity). Each cell 1110, 1120 surrounds the centerpoints 1110A, 1120A. All the points in the cell 1110, 1120 are closest to their corresponding centerpoints 1110A, 1120A, respectively, than to any other centerpoint in the Voronoi diagram 1100. The Voronoi diagram 1100 can exist in a multidimensional space, where each dimension corresponds to a curve deformer. Each centerpoint 1110A, 1120A can represent a single curve deformer.

A point 1130 can represent a location of a point on the surface of the object being deformed using the curve deformer. The location of the point 1130 can be calculated based on spatial distance between the point 1130 and curve deformers represented by centerpoints 1110A, 1120A. The location of the point 1130 can be calculated based on curve-shape similarity, e.g. affinity. For example, if the shape of the curve associated with the point 1130 is most similar to the shape of the curve associated with the curve deformer 1110A, compared to the other curve deformers 1120A, then the point 1130 belongs to the cell 1110A.

The point 1130 belongs to a single cell in the Voronoi diagram 1100 (e.g., cell 1110). The cell 1110 indicates that curve deformer represented by the centerpoint 1110A has the most influence on the points 1130. The influence can be represented as a weight between 0 and 1. A weight of 0 indicates no influence, while the weight of 1 indicates maximum influence. To calculate the influence of the two curve deformers represented by centerpoints 1110A and 1120A, the processor can apply a function of the distance between point 1130 and centerpoints 1110A, 1120A. The function can be a step function 1140 in FIG. 11B indicating that the weight within each cell 1110, 1120 is always 1. Alternatively, the function can be a smooth function 1150 in FIG. 11C that has a value of 1 when point 1130 overlaps the centerpoint 1110A, and gradually reduces to 0 after crossing the boundary 1160. The sum of weights influencing the points 1130 does not exceed one.

FIG. 11B shows a step function that can be applied to interpolating the weights. The x-axis represents the location on the Voronoi diagram 1100 in FIG. 11A, while the y-axis represents the weight. The region 1170 represents the cell 1110 in FIG. 11A. As long as the point 1130 is within the cell 1110, the influence of the curve deformer represented by centerpoint 1110A is one, while the influence of the other curve deformers is 0. As soon as the point 1130 crosses the boundary 1160, the influence of the curve deformer represented by centerpoint 1110A diminishes to 0, while the influence of the curve deformer represented by centerpoint 1120A becomes 1.

Figure 11C:
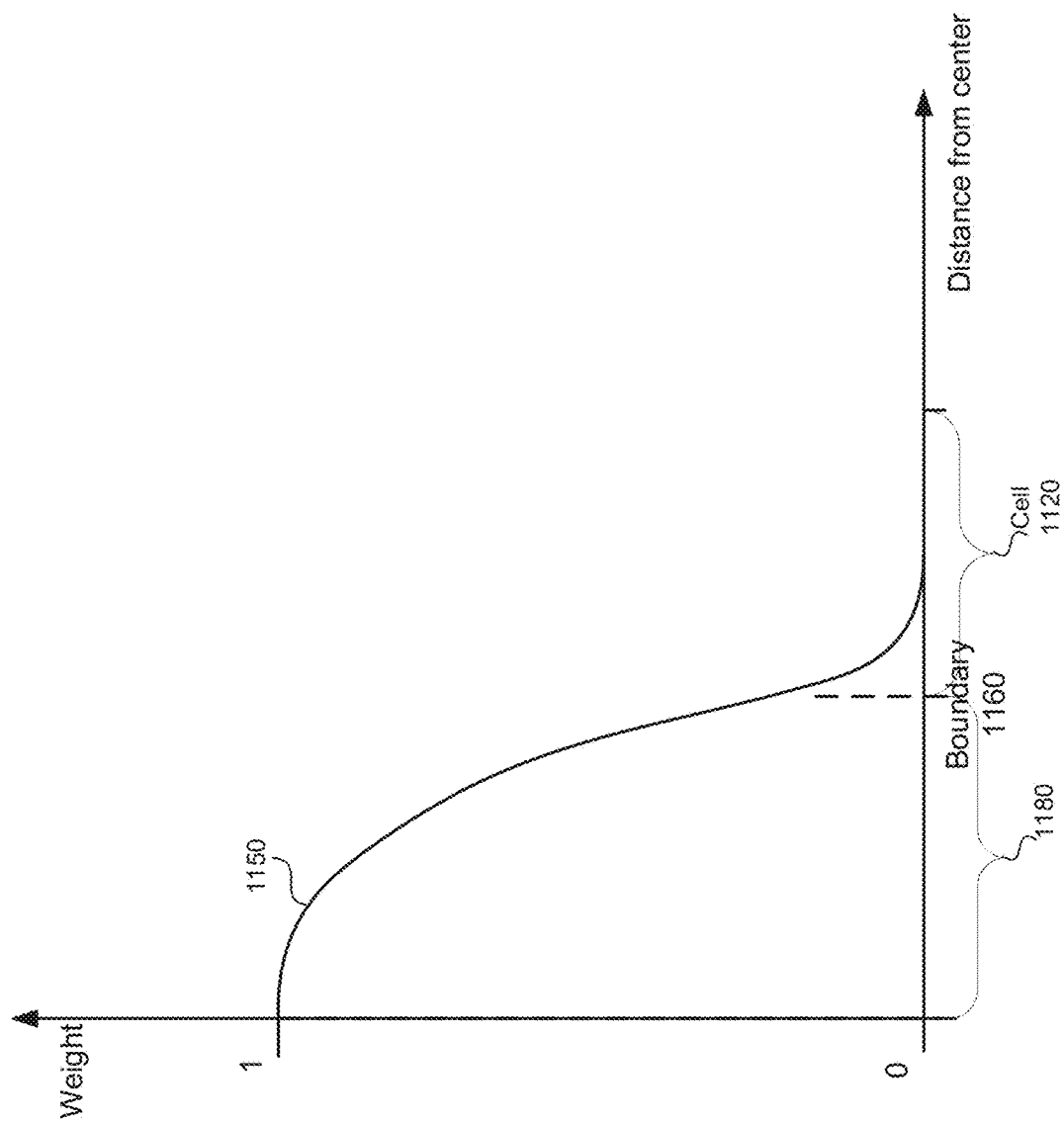
FIG. 11C shows a smooth function that can be applied to interpolating the weights.

FIG. 11C shows a smooth function that can be applied to interpolating the weights. The x-axis represents the location on the Voronoi diagram 1100 in FIG. 11A, while the y-axis represents the weight. The region 1180 represents the distance from the cell center within the cell, such as distance from the cell center 1110A within the cell 1110 in FIG. 11A. When the point 1130 is co-located with the cell center 1110A, the influence of the curve deformer represented by the centerpoint 1110A is 1. The influence gradually decreases to 0. The influence can become 0 after the point 1130 crosses the boundary 1160 and enters the cell 1120. Alternatively, the influence can become 0 at the boundary 1160.

For interpolation, the weight vector $w_1, \ldots, w_m$ should be normalized (i.e. the weights sum up to 1) and all the weights should be non-negative. Further, the pose set should be precisely interpolated, i.e. whenever $l=q_i$ or some i, $w_i=1$ (all other weights are zero as a result). A person of ordinary skill in the art will appreciate that there are two aspects to a Voronoi-based computation of such weights. First, a pose to pose measure of distance needs to be defined that captures the proximity/affinity between poses. Second, these distances between a pose l and poses in the multi-pose set $q_1, \ldots, q_m$ that define Voronoi regions need to be transformed into normalized weights $w_1, \ldots, w_m$, that reflect the proximity/affinity between the curves. Examples of both aspects, are provided below.

Pose-to-pose distance: A simple distance measure for poses defined as a vector of numeric values, is the $L^2$ norm between two such vectors, i.e. for two pose vectors a and b the $L^2$ distance $d(a,b)=\sqrt{(\Sigma^n_{i=1}(a_i-b_i)^2)}$, where $a_i$, $b_i$ are the components of an n-dimensional vector. In the context of wire curves each pose $q_i$, can comprise multiple wire curves $c^1 \ldots c^k$. Each wire curve can then be further represented as a polyline of 3D points, such that curve $c^j=<p^j_1, p^j_1, \ldots, p^j_{nj}>$. The pose vector for $q_i$ can thus be a concatenation of the 3D points for the k curves. Alternately, since the deformation is a weighted sum of the deformation contribution of individual wire curves, fine-grained multi-pose behavior can be computed by defining a subpose-subpose distance for each corresponding wire curve $d_j(q, l)=d(c^j_q, c^j_l)$, where the proximity/affinity of a pose l to a multi-pose q is computed as a sub-pose affinity $d_j$ between the corresponding jth wire curve of l and q.

A person of ordinary skill in the art would also note, that a variety of other curve to curve distance measures such as the Hausdorff distance or the Frechet distance can capture different aspects of geometric similarity between the curves. For the purpose of this application the $L^2$ norm as described above either for the entire pose (set of wire curves), or sub-pose (for each corresponding wire curve) provides the desired notion of proximity/affinity when using wire curves for multi-pose deformation.

Normalized weight vector computation: Given a pose to pose (or sub-pose to sub-pose) distance between a pose l and poses in a multi-pose set $q_1, \ldots, q_m$, a number of functions can provide desired geometric properties of the interpolating weight vector $w_1, \ldots, w_m$. A simple example function sometimes called a nearest neighbor interpolant, given l and $q_1, \ldots, q_m$, returns a weight vector $w_1, \ldots w_m$ where $w_i=1$ for the nearest pose $q_i$ i.e. the pose $q_i$ belonging to $q_1, \ldots, q_m$ for which $d(l,q_i)$ is the smallest. For all other poses where $j \neq i$, $w_j=0$. The sub-pose version of such a function simply picks the nearest neighbor in the multi-pose set for a specific wire curve. The nearest neighbor interpolant essentially defines the geometric deformation based entirely on the nearest multi-pose. As can be expected with such an interpolant, there will likely be discontinuities in the geometric deformation as the manipulated pose l transitions across Voronoi boundaries from one closest multi-pose to another. An example of a weight function with smoother transitions can be defined as follows. Given a pose l and $q_1, \ldots, q_m$, the nearest k neighbors are computed, where the difference in distance from the nearest pose i is less than a factor j (for example j=0.5) of the nearest distance $d(l,q_j)-d(l,q_i)<=j*d(l,q_i)$. The weight $w_j=f(d(l,q_j)-d(l,q_i)/j*d(l,q_i))$, where f(x) is a sigmoid function with f(x)=0 for x>1 and smoothly falls off from f(x)=1 at x=0 to f(x)=0 at x=1. An example of such a function in the domain [0,1] is $f(x)=(x^2-1)^2$. Finally, resulting weight vector is then normalized by dividing each weight by the sum of the weights. Note that the above smooth interpolant degenerates to the nearest neighbor interpolant when j=1. Other smooth fall-off functions and Voronoi based weight interpolants can also be used.

General multi-pose Attribute Interpolation: Interpolation of attributes in general for deformable objects: As described in this application the multi-pose deformation framework is designed to control the shape (position of points) of an object based on its spatial relationship and manipulation of deformation proxy geometry like wire curves. To restate the general deformation formulation:

$$M'=\text{deform-interpolate}_{f \in F}(M^f, f, \text{bind-interpolate}_{b \in B}(M^b, b, l), r^f, l) + \text{disp-interpolate}_{q \in Q}(l, q, D^q).$$

All stages bind, deform, and disp are a functional interpolation of a deformation mapping of point position on an object. The interpolation is based on interpolation weights calculated using the relationship between the object and the geometry of the deformation proxy. A person of ordinary skill in the art will appreciate that these interpolation weight values can be used to meaningfully interpolate general numeric attributes defined at points on the object as the following example will illustrate: Two bind poses can be defined for a relaxed/neutral and angry face geometry, for example associated with multi-pose wire curves that define a relaxed and deeply furrowed brow shape respectively. We can look at this example under the simplified formulation where only the deform function is interpolated, i.e. $M'=\text{deform-interpolate}_{f \in F}(M^f, b, W^b, r^f, l)$. Here, the set of multi-pose curves F is of size 2, i.e. the brow curve $r^1$ and $r^2$ for the relaxed/neutral $M^1$ and angry $M^2$ face geometry respectively. The geometry could be bound to the relaxed brow, i.e. $b=r^1$, and bind parameters $W^b$ computed by binding $r^1$ to $M^1$.

Using these bind parameters, given an animated brow curve l, the 3D positions of points on the face are deformed both from $M^1$ and $M^2$ to manifest the relative change between pose $r^1$ and l, and between pose $r^2$ and l, respectively. The final deformed positions of points are a multi-pose interpolation of between the deformed results due to the two reference poses. The interpolation weights are defined based on the proximity/affinity between the curve l, and the multi-pose reference curves $r^1$ and $r^2$ respectively (the greater the proximity the greater the weight). In addition to the deformable geometry for different facial expressions/poses, the multi-pose framework can have different values for other attributes such as UV co-ordinates that define a texture parameterization, or texture map images representing the skin tone, wrinkling and blood flow in the face. For instance, the UV parameters may be displaced from a neutral to angry expression, to simulate the travel of a fine wrinkle along the skin in a wrinkle texture image. Similarly, a different blood flow texture image might be used to convey increased blood flow in an angry face. The brow curve l on animation as described may deform the skin geometry based on interpolation weights for $r^1$ and $r^2$ as aforementioned, but may also (or alternatively) be used to interpolate the UV-texture co-ordinates, or pixel color of the blood flow texture images, defined for the neutral and angry face. In general thus, the interpolation weights computed for pose l relative to the multi-poses f∈F, may be used to data-interpolate any generic numeric attribute associated with each of the poses f∈F.

Figure 12:
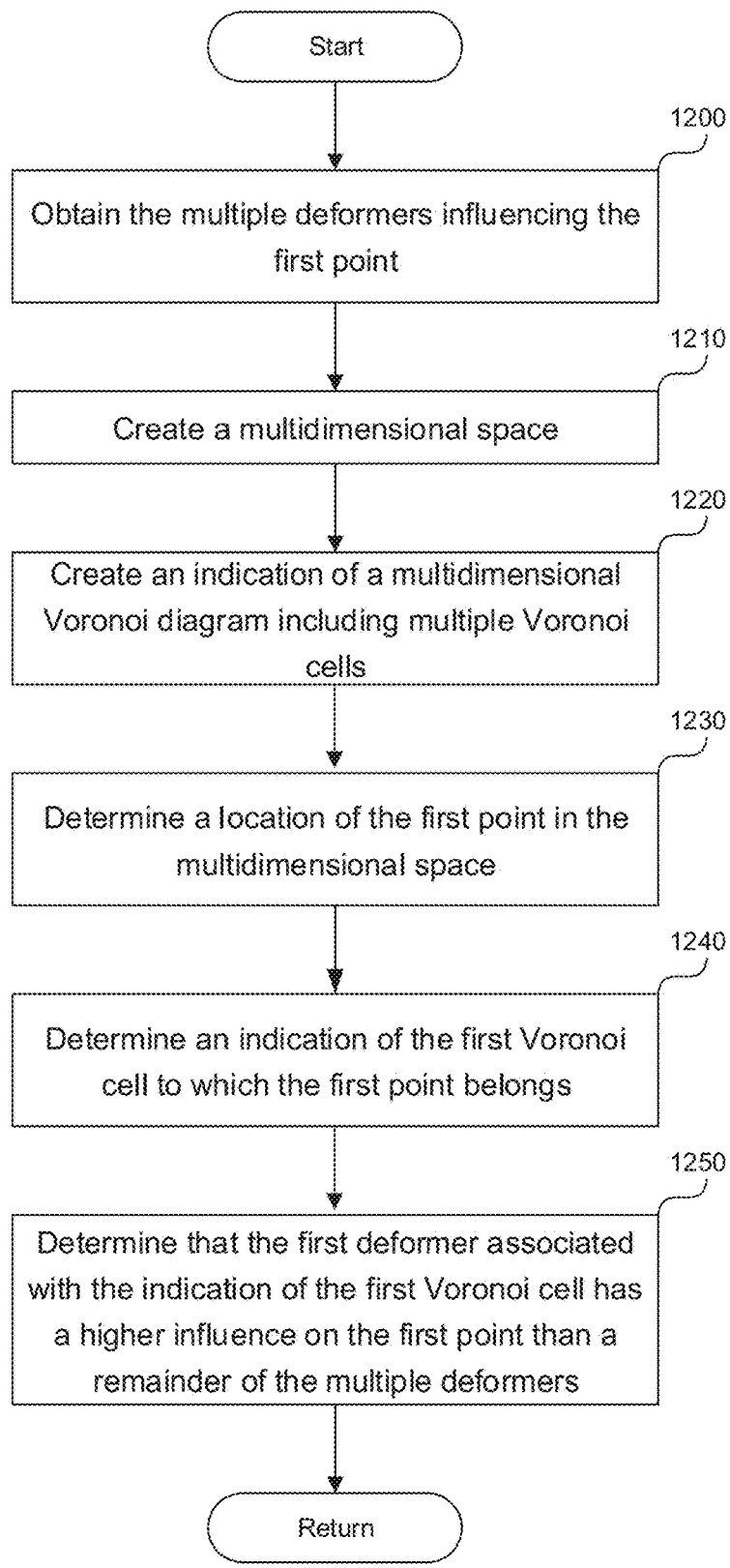
FIG. 12 is a flowchart of a method to determine an influence of a deformer among multiple deformers on the first point.

FIG. 12 is a flowchart of a method to determine an influence of a deformer among multiple deformers on the first point. The deformer can be a curve deformer, a lattice deformer, a cluster deformer, a bend deformer, or a multi-pose deformer etc. In step 1200, a hardware or a software processor executing instructions described in this application can obtain the multiple deformers influencing the first point.

In step 1210, the processor can create a multidimensional space, where a first dimension in the multidimensional space corresponds to a first deformer among the multiple deformers. In step 1220, the processor can create an indication of a multidimensional Voronoi diagram including multiple Voronoi cells, where a center of a first Voronoi cell among the multiple Voronoi cells corresponds to the first deformer. In one implementation, the indication of the multidimensional Voronoi diagram can be an affinity function indicating a proximity of the first point to the first deformer. In other words, the processor does not have to create a multidimensional Voronoi diagram. The processor can calculate affinity functions between the first point and the multiple deformers, where the Voronoi diagram can be computed from the affinity functions. The affinity functions indicate the proximity between the first point and the first deformer. In another implementation, the processor can explicitly compute the Voronoi diagram.

For example, to create the indication of the multidimensional Voronoi diagram, the processor can compute multiple affinity functions where each affinity function among the multiple affinity functions corresponds to a particular deformer among the multiple deformers, and where each affinity function among the multiple affinity function indicates an influence of the corresponding deformer on the first point.

In step 1230, the processor can determine a location of the first point in the multidimensional space. In one implementation, to determine the location of the first point in the multidimensional space, the processor can obtain a shape associated with the deformer and a shape associated with the first point. The processor can determine a similarity between the shape associated with the deformer and the shape associated with the first point. Based on the similarity, the processor can determine the location of the first point in the multidimensional space. In another implementation, to determine the location of the first point in the multidimensional space, the processor can obtain a location associated with the deformer in a three-dimensional space, and a location associated with the first point in the three-dimensional space. The processor can compute a distance between the deformer and the first point in the three-dimensional space. Based on the distance, the processor can determine the location of the first point in the multidimensional space.

In step 1240, based on the location of the first point to the multidimensional space, the processor can determine the indication of the first Voronoi cell to which the first point belongs. For example, to determine the indication of the first Voronoi cell to which the point belongs, the processor can determine a deformer among the multiple deformers having a higher influence on the first point than a remainder of the multiple deformers.

In step 1250, the processor can determine that the first deformer associated with the first Voronoi cell has a higher influence on the first point than a remainder of the multiple deformers.

To determine the influence of the various deformers, the processor can obtain an indication of a boundary associated with the first Voronoi cell, where the indication of the boundary separates the indication of the first Voronoi cell and an indication of a second Voronoi cell among the multiple Voronoi cells, and where the indication of the first Voronoi cell is associated with the first deformer, and the indication of the second Voronoi cell is associated with the second deformer. The indication of the boundary can include a region where the first influence associated with the first point and the second influence associated with the first point are substantially equal. Substantially equal indicates that the first and second influence are within 20% of each other.

In one implementation, the processor can determine a distance between the first point and the indication of the boundary associated with the first Voronoi cell. Based on the distance, the processor can determine a first influence associated with the first deformer, and a second influence associated with the second deformer. For example, the first influence can decrease as the first point approaches the indication of the boundary, while the second influence can increase as the first point approaches the boundary. In another implementation, upon determining the first Voronoi cell to which the first point belongs, the processor can determine that only the first Voronoi cell influences the first point.

Figure 13A:
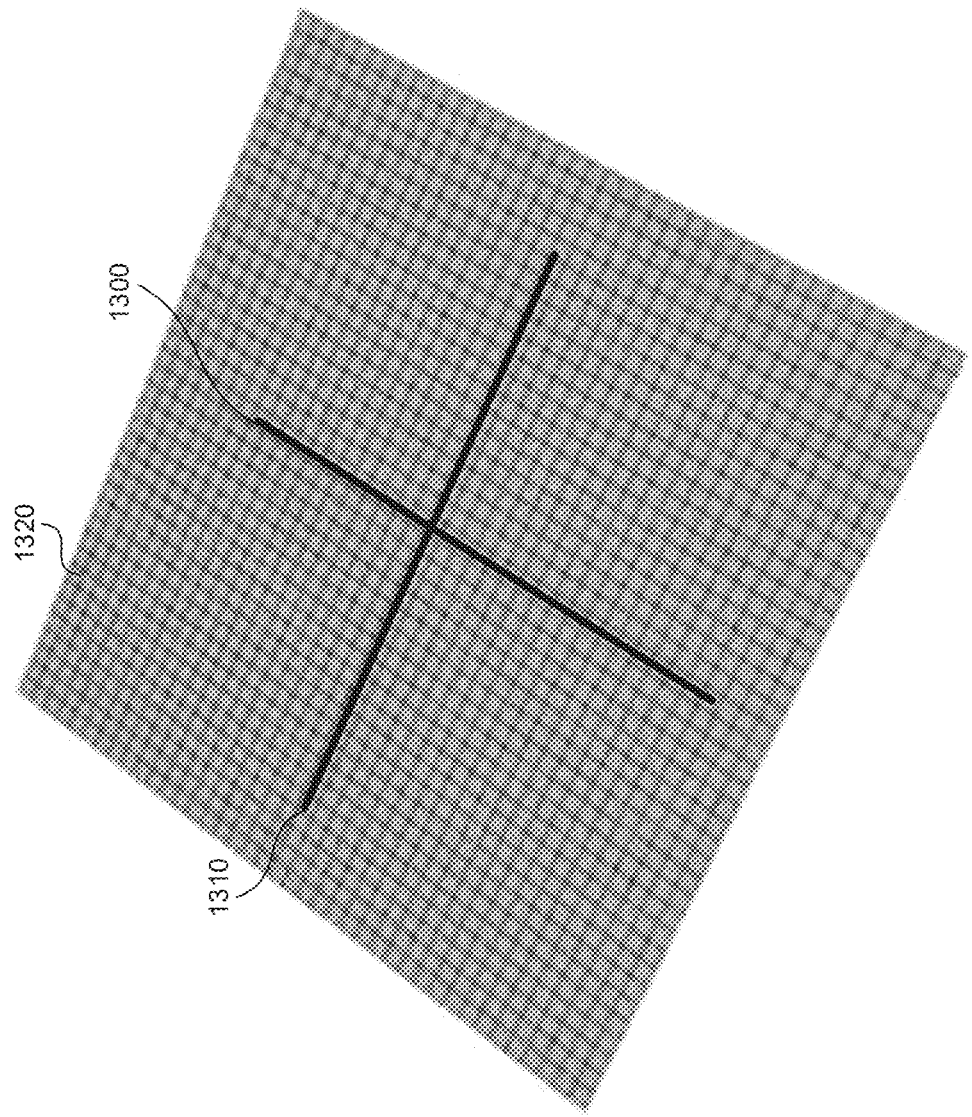
FIGS. 13A-13C show the deformation due to two curves on a geometric plane.
Figure 13B:
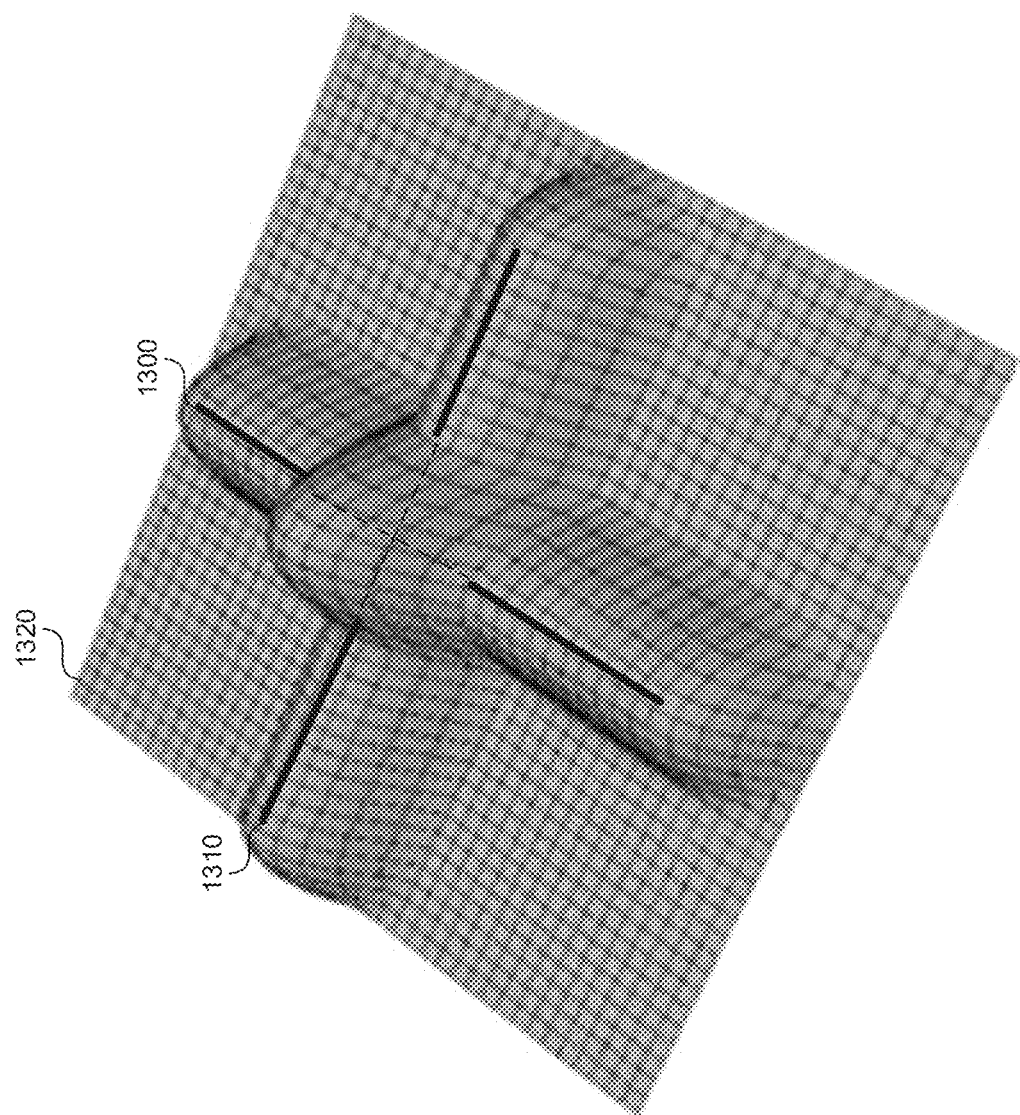
Figure 13C:
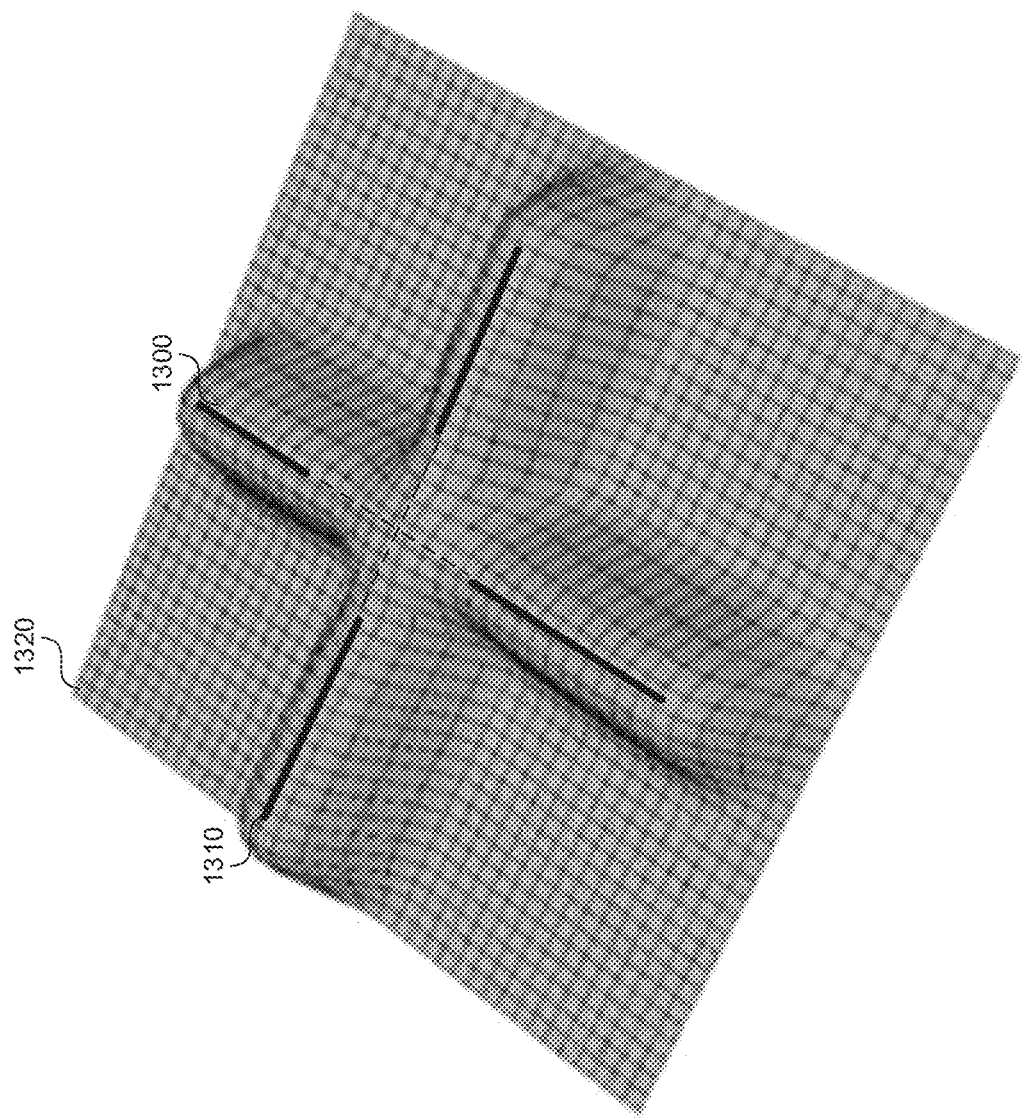

FIGS. 13A-13C show the deformation due to two curves on a geometric plane. Two curves, e.g. curve deformers, 1300, 1310 can deform a planar geometry 1320. When the curve deformers 1300, 1310 are lifted off the plane 1320 and their individual deformation contributions is summed together, the curve deformers 1300, 1310 produce a double deformation shown in deformation in FIG. 13B. The original wires deformer addressed this cumulative deformation by weighting the deformation to favor the deformation contributed by curves whose magnitude of deformation was large. In this application, we address this problem by a weighted sum of individual curve deformations 1300, 1310, where a normalized weight contribution is computed for each curve deformer based on the proximity/affinity/similarity between the point being deformed and the closest point to it on the curve deformer.

Figure 14A:
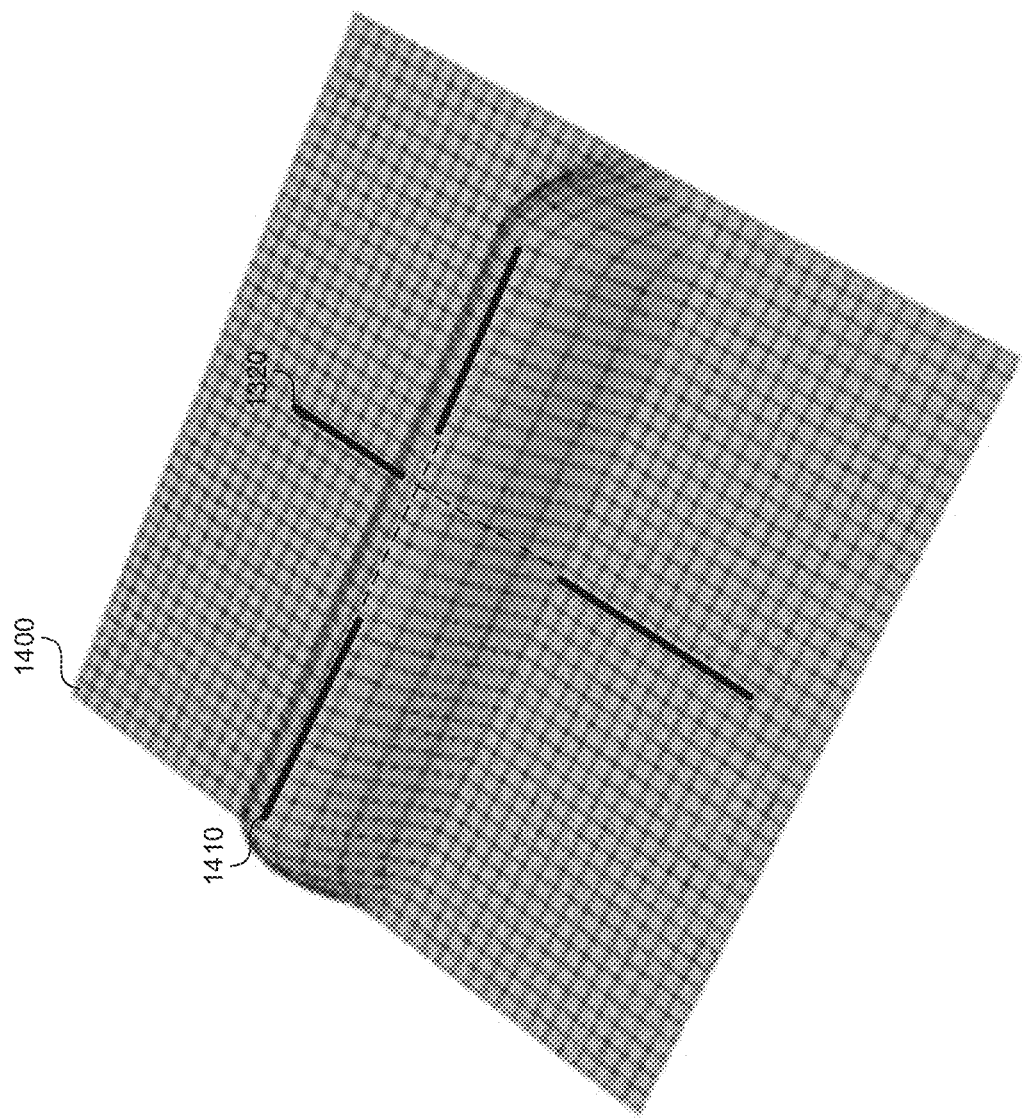
FIGS. 14A-14B show a comparison between deformations produced by the original wire deformer and the deformer disclosed in this application.
Figure 14B:
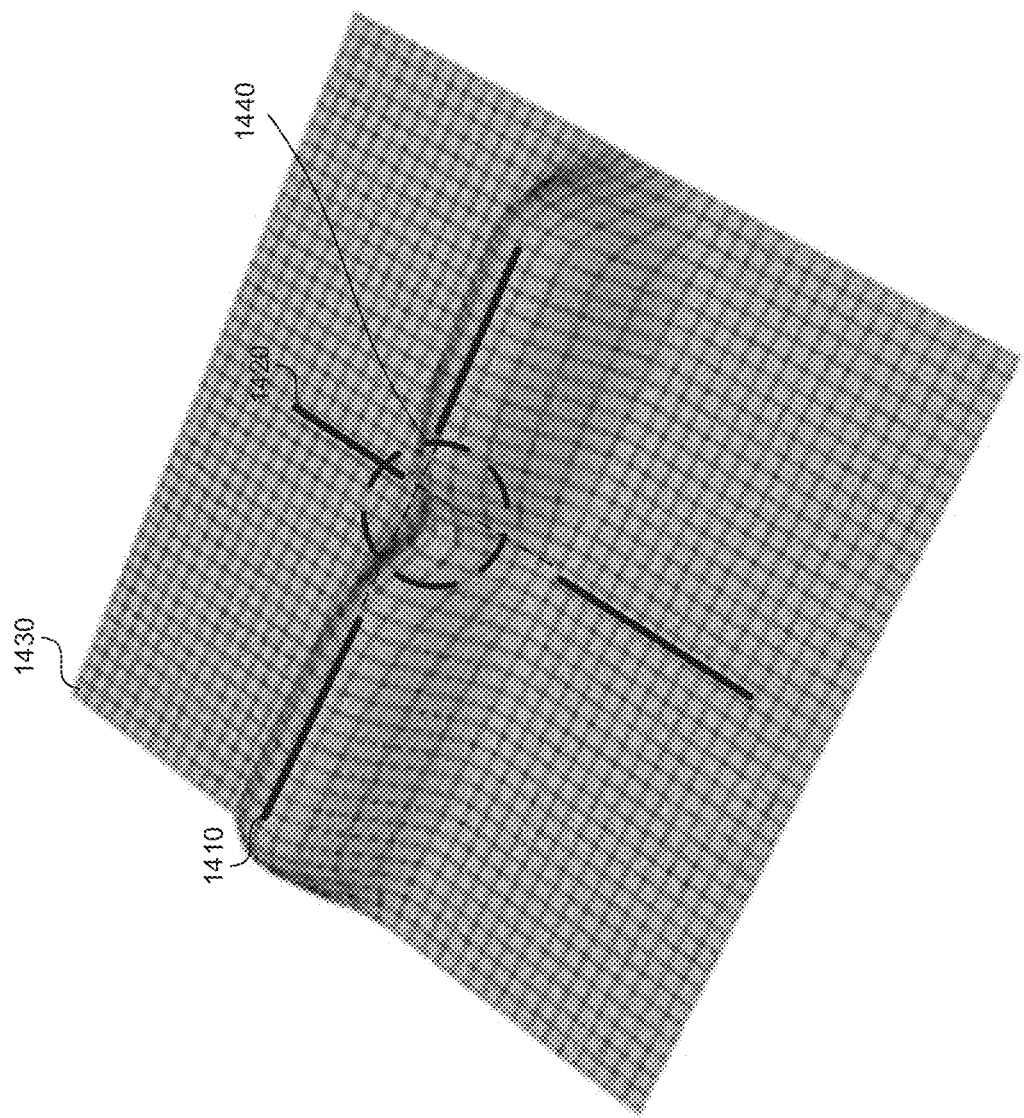

FIGS. 14A-14B show a comparison between deformations produced by the original wire deformer and the deformer disclosed in this application. As FIG. 14A shows, the original wire formulation was intended for the deformer curves to be independent of each other. As a result, the original wire formulation was designed to produce a deformation that favored individual curve deformations of large magnitude. In FIG. 14A, the geometry 1400 deforms as if completely controlled by the more horizontal curve 1410, because the more vertical curve 1420 does not induce any deformation. In the current application, multiple curves in any configuration or pose can together provide definition to the deformed geometry 1430 based on the affinity of geometric points to the curves 1410, 1420. The system enables this by computing affinity based normalized weights for the curves 1410, 1420. In FIG. 14B, the more vertical curve 1420, thus also controls the deformation (or lack of deformation) of geometry 1430 as seen in the center region 1440 where points on the geometry are equally proximal to both curves 1410, 1420.

As shown in FIG. 13B, simply adding the deformation contribution from multiple curves can produce unwanted bulges in the deformed geometry. The original wire technique addressed this issue by weighted deformation contributions from individual curves by their magnitude of deformation as seen in FIG. 14A. Such behavior is reasonable if each curve is considered as an independent deformer. In this application however, the set of multiple wire curves are viewed as a single deformation proxy, that together control the geometry. We thus sum the weighted combination as above where $w^j=1/(1+k^*\|c^b(pr)-p\|^2)$, is a function that returns $w^j=1$ when the distance between the point and curve is 0, and decays in weight towards 0 (scaled by a constant k) with increasing distance between the point and curve; these weights can then be normalized by dividing each weight by $\Sigma^{n_j=1} w^j$. In place of Euclidean distance $\|c^b(pr)-p\|^2$ to measure proximity, other affinity functions can be used. For example, curves that are better oriented with the geometric surface at a point p can have a higher affinity which can be measured using a dot product $(t \cdot n)^2$, between the surface normal n at point p and the curve tangent t at the closest point on the curve. Note the orientation distance $(t \cdot n)^2=0$ when the curve lies in the local tangent plane of the surface and 1 when the curve is parallel to the local surface normal.

Visual Content Generation System

Figure 15:
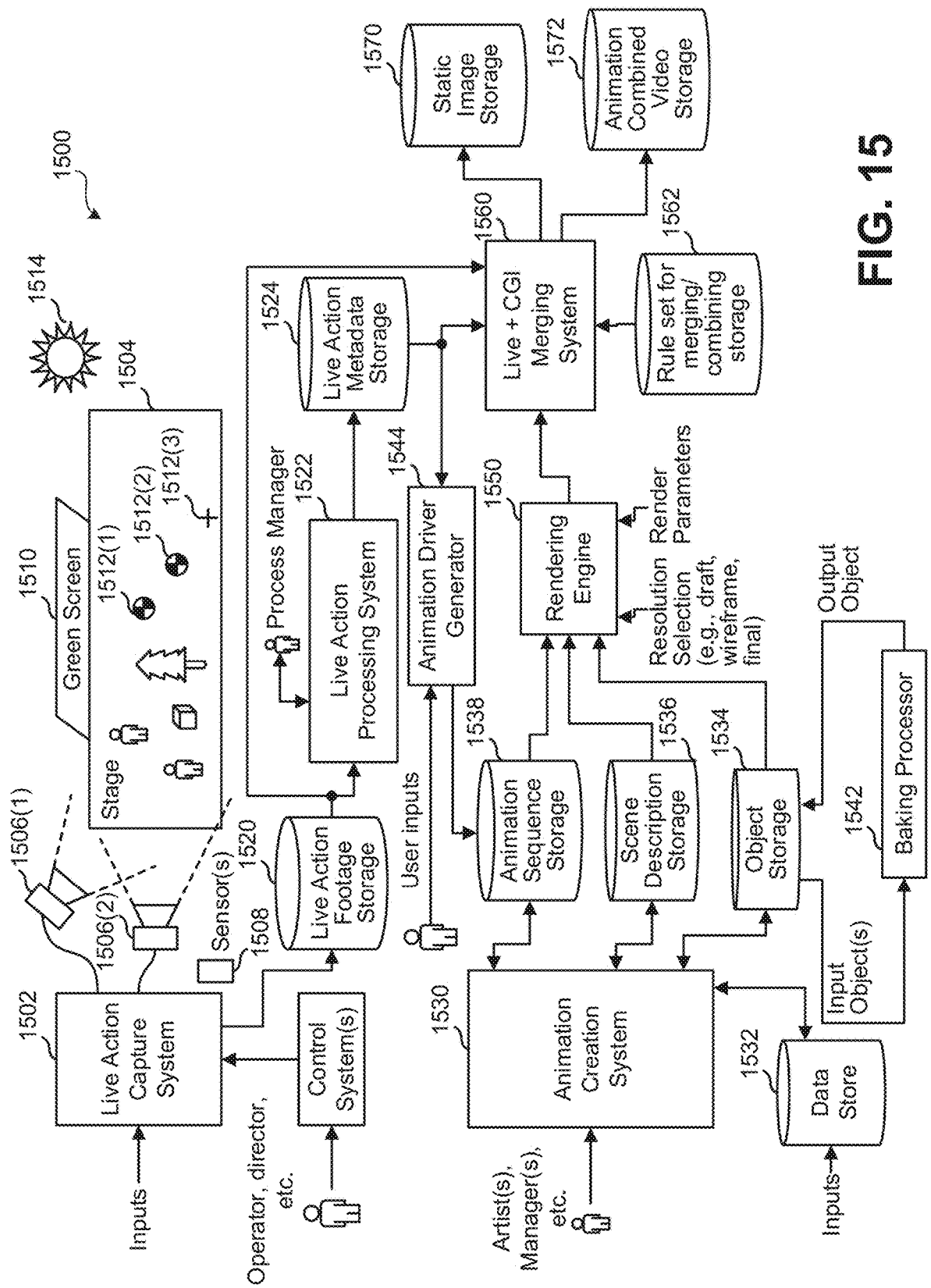
FIG. 15 illustrates an example visual content generation system as might be used to generate imagery in the form of still images and/or video sequences of images.

FIG. 15 illustrates an example visual content generation system 1500 as might be used to generate imagery in the form of still images and/or video sequences of images. Visual content generation system 1500 might generate imagery of live action scenes, computer generated scenes, or a combination thereof. In a practical system, users are provided with tools that allow them to specify, at high levels and low levels where necessary, what is to go into that imagery. For example, a user might be an animation artist and might use visual content generation system 1500 to capture interaction between two human actors performing live on a sound stage and replace one of the human actors with a computer-generated anthropomorphic non-human being that behaves in ways that mimic the replaced human actor's movements and mannerisms, and then add in a third computer-generated character and background scene elements that are computer-generated, all in order to tell a desired story or generate desired imagery.

Still images that are output by visual content generation system 1500 might be represented in computer memory as pixel arrays, such as a two-dimensional array of pixel color values, each associated with a pixel having a position in a two-dimensional image array. Pixel color values might be represented by three or more (or fewer) color values per pixel, such as a red value, a green value, and a blue value (e.g., in RGB format). Dimensions of such a two-dimensional array of pixel color values might correspond to a preferred and/or standard display scheme, such as 1920-pixel columns by 1280-pixel rows or 4096-pixel columns by 2160-pixel rows, or some other resolution. Images might or might not be stored in a certain structured format, but either way, a desired image may be represented as a two-dimensional array of pixel color values. In another variation, images are represented by a pair of stereo images for three-dimensional presentations and in other variations, an image output, or a portion thereof, might represent three-dimensional imagery instead of just two-dimensional views. In yet other embodiments, pixel values are data structures and a pixel value can be associated with a pixel and can be a scalar value, a vector, or another data structure associated with a corresponding pixel. That pixel value might include color values, or not, and might include depth values, alpha values, weight values, object identifiers or other pixel value components.

A stored video sequence might include a plurality of images such as the still images described above, but where each image of the plurality of images has a place in a timing sequence and the stored video sequence is arranged so that when each image is displayed in order, at a time indicated by the timing sequence, the display presents what appears to be moving and/or changing imagery. In one representation, each image of the plurality of images is a video frame having a specified frame number that corresponds to an amount of time that would elapse from when a video sequence begins playing until that specified frame is displayed. A frame rate might be used to describe how many frames of the stored video sequence are displayed per unit time. Example video sequences might include 24 frames per second (24 FPS), 50 FPS, 140 FPS, or other frame rates. In some embodiments, frames are interlaced or otherwise presented for display, but for clarity of description, in some examples, it is assumed that a video frame has one specified display time, but other variations might be contemplated.

One method of creating a video sequence is to simply use a video camera to record a live action scene, i.e., events that physically occur and can be recorded by a video camera. The events being recorded can be events to be interpreted as viewed (such as seeing two human actors talk to each other) and/or can include events to be interpreted differently due to clever camera operations (such as moving actors about a stage to make one appear larger than the other despite the actors actually being of similar build, or using miniature objects with other miniature objects so as to be interpreted as a scene containing life-sized objects).

Creating video sequences for story-telling or other purposes often calls for scenes that cannot be created with live actors, such as a talking tree, an anthropomorphic object, space battles, and the like. Such video sequences might be generated computationally rather than capturing light from live scenes. In some instances, an entirety of a video sequence might be generated computationally, as in the case of a computer-animated feature film. In some video sequences, it is desirable to have some computer-generated imagery and some live action, perhaps with some careful merging of the two.

While computer-generated imagery might be creatable by manually specifying each color value for each pixel in each frame, this is likely too tedious to be practical. As a result, a creator uses various tools to specify the imagery at a higher level. As an example, an artist might specify the positions in a scene space, such as a three-dimensional coordinate system, of objects and/or lighting, as well as a camera viewpoint, and a camera view plane. From that, a rendering engine could take all of those as inputs, and compute each of the pixel color values in each of the frames. In another example, an artist specifies position and movement of an articulated object having some specified texture rather than specifying the color of each pixel representing that articulated object in each frame.

In a specific example, a rendering engine performs ray tracing wherein a pixel color value is determined by computing which objects lie along a ray traced in the scene space from the camera viewpoint through a point or portion of the camera view plane that corresponds to that pixel. For example, a camera view plane might be represented as a rectangle having a position in the scene space that is divided into a grid corresponding to the pixels of the ultimate image to be generated, and if a ray defined by the camera viewpoint in the scene space and a given pixel in that grid first intersects a solid, opaque, blue object, that given pixel is assigned the color blue. Of course, for modern computer-generated imagery, determining pixel colors—and thereby generating imagery—can be more complicated, as there are lighting issues, reflections, interpolations, and other considerations.

As illustrated in FIG. 15, a live action capture system 1502 captures a live scene that plays out on a stage 1504. Live action capture system 1502 is described herein in greater detail, but might include computer processing capabilities, image processing capabilities, one or more processors, program code storage for storing program instructions executable by the one or more processors, as well as user input devices and user output devices, not all of which are shown.

In a specific live action capture system, cameras 1506(1) and 1506(2) capture the scene, while in some systems, there might be other sensor(s) 1508 that capture information from the live scene (e.g., infrared cameras, infrared sensors, motion capture ("mo-cap") detectors, etc.). On stage 1504, there might be human actors, animal actors, inanimate objects, background objects, and possibly an object such as a green screen 1510 that is designed to be captured in a live scene recording in such a way that it is easily overlaid with computer-generated imagery. Stage 1504 might also contain objects that serve as fiducials, such as fiducials 1512(1)-(3), that might be used post-capture to determine where an object was during capture. A live action scene might be illuminated by one or more lights, such as an overhead light 1514.

During or following the capture of a live action scene, live action capture system 1502 might output live action footage to a live action footage storage 1520. A live action processing system 1522 might process live action footage to generate data about that live action footage and store that data into a live action metadata storage 1524. Live action processing system 1522 might include computer processing capabilities, image processing capabilities, one or more processors, program code storage for storing program instructions executable by the one or more processors, as well as user input devices and user output devices, not all of which are shown. Live action processing system 1522 might process live action footage to determine boundaries of objects in a frame or multiple frames, determine locations of objects in a live action scene, where a camera was relative to some action, distances between moving objects and fiducials, etc. Where elements have sensors attached to them or are detected, the metadata might include location, color, and intensity of overhead light 1514, as that might be useful in post-processing to match computer-generated lighting on objects that are computer-generated and overlaid on the live action footage. Live action processing system 1522 might operate autonomously, perhaps based on predetermined program instructions, to generate and output the live action metadata upon receiving and inputting the live action footage. The live action footage can be camera-captured data as well as data from other sensors.

An animation creation system 1530 is another part of visual content generation system 1500. Animation creation system 1530 might include computer processing capabilities, image processing capabilities, one or more processors, program code storage for storing program instructions executable by the one or more processors, as well as user input devices and user output devices, not all of which are shown. Animation creation system 1530 might be used by animation artists, managers, and others to specify details, perhaps programmatically and/or interactively, of imagery to be generated. From user input and data from a database or other data source, indicated as a data store 1532, animation creation system 1530 might generate and output data representing objects (e.g., a horse, a human, a ball, a teapot, a cloud, a light source, a texture, etc.) to an object storage 1534, generate and output data representing a scene into a scene description storage 1536, and/or generate and output data representing animation sequences to an animation sequence storage 1538.

The animation creation system 1530 can be used to create various animations using deformers described in this application. For example, the animation creation system 1530 can obtain a three-dimensional object 110 in FIG. 1 from the data store 1532, object storage 1534, and/or scene description storage 1536. The user can generate the deformer information such as deformer parameters and pass the deformer information to the animation creation system 1530 via the animation driver generator and 1544. In addition, the user can, but does not have to, specify the change of the deformer parameters over time, to create an animation. The animation creation system 1530 can apply the animation to the three-dimensional object 110. The rendering engine 1550 can render the animation of the three-dimensional object 110, and produce images for user's viewing.

The three-dimensional object 110 can come from various sources. In one example, the three-dimensional object can be sculpted by the same or different user. In another example, the three-dimensional object can come from a live action set, and can arrive to the animation creation system 1530 via the live action processing system 1522. In a third example, the three-dimensional object can be an input or an output associated with a simulation. Specifically, the user can animate an input to the simulation prior to operating a simulator. Alternatively, the user can receive an output from the simulator, and can adjust the simulator output by animating the three-dimensional object 110.

In addition to points on the three-dimensional object, the animation creation system 1530 can also animate other aspects of the three-dimensional object 110 such as shading parameters, textures, color, etc.

Scene data might indicate locations of objects and other visual elements, values of their parameters, lighting, camera location, camera view plane, and other details that a rendering engine 1550 might use to render CGI imagery. For example, scene data might include the locations of several articulated characters, background objects, lighting, etc. specified in a two-dimensional space, three-dimensional space, or other dimensional space (such as a 2.5-dimensional space, three-quarter dimensions, pseudo-3D spaces, etc.)

along with locations of a camera viewpoint and view place from which to render imagery. For example, scene data might indicate that there is to be a red, fuzzy, talking dog in the right half of a video and a stationary tree in the left half of the video, all illuminated by a bright point light source that is above and behind the camera viewpoint. In some cases, the camera viewpoint is not explicit, but can be determined from a viewing frustum. In the case of imagery that is to be rendered to a rectangular view, the frustum would be a truncated pyramid. Other shapes for a rendered view are possible and the camera view plane could be different for different shapes.

Animation creation system 1530 might be interactive, allowing a user to read in animation sequences, scene descriptions, object details, etc. and edit those, possibly returning them to storage to update or replace existing data. As an example, an operator might read in objects from object storage into a baking processor 1542 that would transform those objects into simpler forms and return those to object storage 1534 as new or different objects. For example, an operator might read in an object that has dozens of specified parameters (movable joints, color options, textures, etc.), select some values for those parameters and then save a baked object that is a simplified object with now fixed values for those parameters.

Rather than requiring user specification of each detail of a scene, data from data store 1532 might be used to drive object presentation. For example, if an artist is creating an animation of a spaceship passing over the surface of the Earth, instead of manually drawing or specifying a coastline, the artist might specify that animation creation system 1530 is to read data from data store 1532 in a file containing coordinates of Earth coastlines and generate background elements of a scene using that coastline data.

Animation sequence data might be in the form of time series of data for control points of an object that has attributes that are controllable. For example, an object might be a humanoid character with limbs and joints that are movable in manners similar to typical human movements. An artist can specify an animation sequence at a high level, such as "the left hand moves from location (X1, Y1, Z1) to (X2, Y2, Z2) over time T1 to T2", at a lower level (e.g., "move the elbow joint 2.5 degrees per frame") or even at a very high level (e.g., "character A should move, consistent with the laws of physics that are given for this scene, from point P1 to point P2 along a specified path").

Animation sequences in an animated scene might be specified by what happens in a live action scene. An animation driver generator 1544 might read in live action metadata, such as data representing movements and positions of body parts of a live actor during a live action scene. Animation driver generator 1544 might generate corresponding animation parameters to be stored in animation sequence storage 1538 for use in animating a CGI object. This can be useful where a live action scene of a human actor is captured while wearing mo-cap fiducials (e.g., high-contrast markers outside actor clothing, high-visibility paint on actor skin, face, etc.) and the movement of those fiducials is determined by live action processing system 1522. Animation driver generator 1544 might convert that movement data into specifications of how joints of an articulated CGI character are to move over time.

A rendering engine 1550 can read in animation sequences, scene descriptions, and object details, as well as rendering engine control inputs, such as a resolution selection and a set of rendering parameters. Resolution selection might be useful for an operator to control a trade-off between speed of rendering and clarity of detail, as speed might be more important than clarity for a movie maker to test some interaction or direction, while clarity might be more important than speed for a movie maker to generate data that will be used for final prints of feature films to be distributed. Rendering engine 1550 might include computer processing capabilities, image processing capabilities, one or more processors, program code storage for storing program instructions executable by the one or more processors, as well as user input devices and user output devices, not all of which are shown.

Visual content generation system 1500 can also include a merging system 1560 that merges live footage with animated content. The live footage might be obtained and input by reading from live action footage storage 1520 to obtain live action footage, by reading from live action metadata storage 1524 to obtain details such as presumed segmentation in captured images segmenting objects in a live action scene from their background (perhaps aided by the fact that green screen 1510 was part of the live action scene), and by obtaining CGI imagery from rendering engine 1550.

A merging system 1560 might also read data from rulesets for merging/combining storage 1562. A very simple example of a rule in a ruleset might be "obtain a full image including a two-dimensional pixel array from live footage, obtain a full image including a two-dimensional pixel array from rendering engine 1550, and output an image where each pixel is a corresponding pixel from rendering engine 1550 when the corresponding pixel in the live footage is a specific color of green, otherwise output a pixel value from the corresponding pixel in the live footage."

Merging system 1560 might include computer processing capabilities, image processing capabilities, one or more processors, program code storage for storing program instructions executable by the one or more processors, as well as user input devices and user output devices, not all of which are shown. Merging system 1560 might operate autonomously, following programming instructions, or might have a user interface or programmatic interface over which an operator can control a merging process. In some embodiments, an operator can specify parameter values to use in a merging process and/or might specify specific tweaks to be made to an output of merging system 1560, such as modifying boundaries of segmented objects, inserting blurs to smooth out imperfections, or adding other effects. Based on its inputs, merging system 1560 can output an image to be stored in a static image storage 1570 and/or a sequence of images in the form of video to be stored in an animated/combined video storage 1572.

Thus, as described, visual content generation system 1500 can be used to generate video that combines live action with computer-generated animation using various components and tools, some of which are described in more detail herein. While visual content generation system 1500 might be useful for such combinations, with suitable settings, it can be used for outputting entirely live action footage or entirely CGI sequences. The code may also be provided and/or carried by a transitory computer readable medium, e.g., a transmission medium such as in the form of a signal transmitted over a network.

According to one embodiment, the techniques described herein are implemented by one or more generalized computing systems programmed to perform the techniques pursuant to program instructions in firmware, memory, other storage, or a combination. Special-purpose computing devices may be used, such as desktop computer systems, portable computer systems, handheld devices, networking devices or any other device that incorporates hard-wired and/or program logic to implement the techniques.

One embodiment might include a carrier medium carrying image data or other data having details generated using the methods described herein. The carrier medium can comprise any medium suitable for carrying the image data or other data, including a storage medium, e.g., solid-state memory, an optical disk or a magnetic disk, or a transient medium, e.g., a signal carrying the image data such as a signal transmitted over a network, a digital signal, a radio frequency signal, an acoustic signal, an optical signal or an electrical signal.

Computer System

Figure 16:
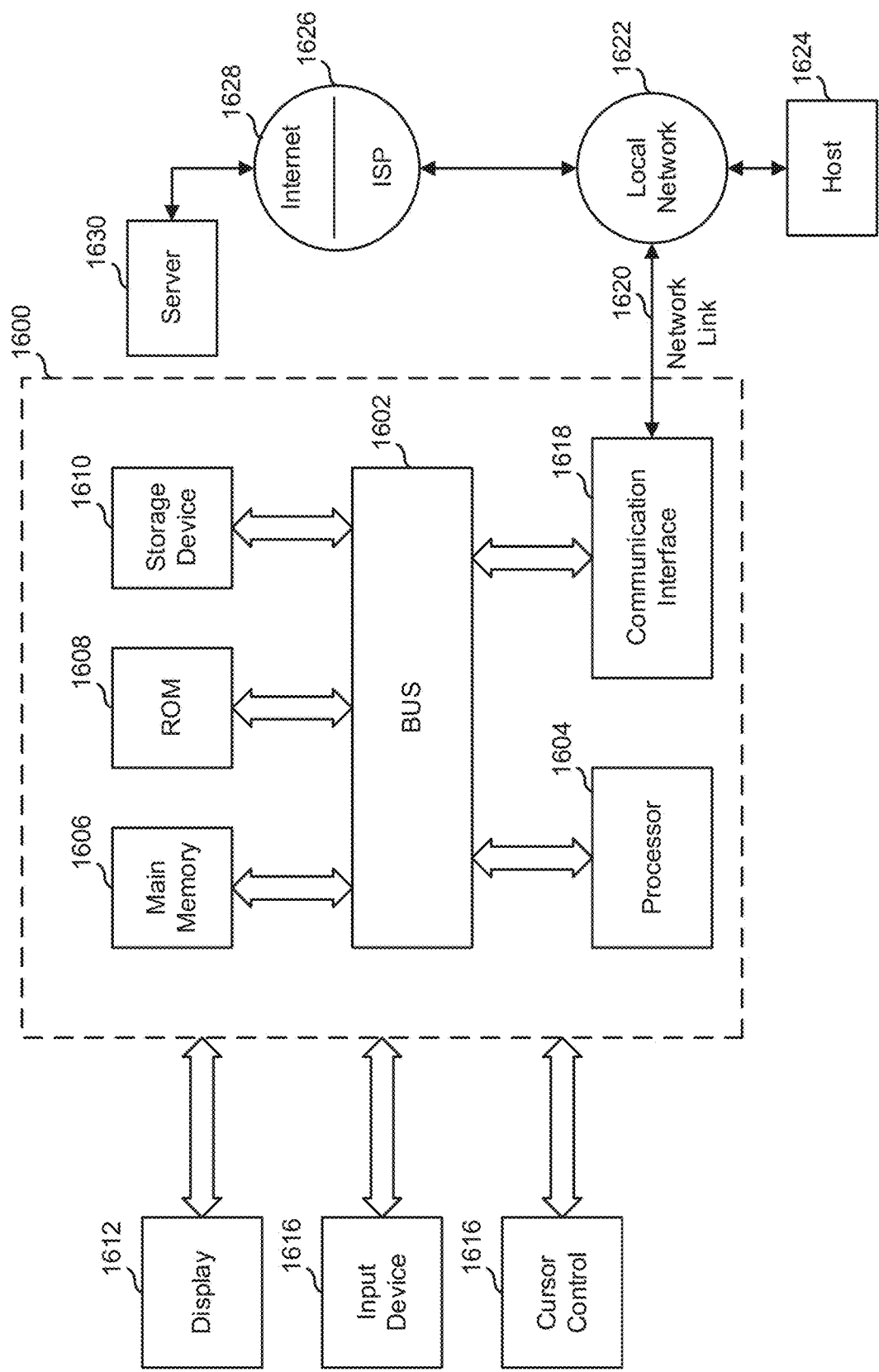
FIG. 16 is a block diagram that illustrates a computer system upon which the computer systems of the systems described herein and/or visual content generation system may be implemented.

FIG. 16 is a block diagram that illustrates a computer system 1600 upon which the computer systems of the systems described herein and/or visual content generation system 1500 (see FIG. 15) may be implemented. Computer system 1600 includes a bus 1602 or other communication mechanism for communicating information, and a processor 1604 coupled with bus 1602 for processing information. Processor 1604 may be, for example, a general-purpose microprocessor.

Computer system 1600 also includes a main memory 1606, such as a random-access memory (RAM) or other dynamic storage device, coupled to bus 1602 for storing information and instructions to be executed by processor 1604. Main memory 1606 may also be used for storing temporary variables or other intermediate information during execution of instructions to be executed by processor 1604. Such instructions, when stored in non-transitory storage media accessible to processor 1604, render computer system 1600 into a special-purpose machine that is customized to perform the operations specified in the instructions.

Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a computer monitor, for displaying information to a computer user. An input device 1614, including alphanumeric and other keys, is coupled to bus 1602 for communicating information and command selections to processor 1604. Another type of user input device is a cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane.

Computer system 1600 may implement the techniques described herein using customized hard-wired logic, one or more ASICs or FPGAs, firmware and/or program logic which in combination with the computer system causes or programs computer system 1600 to be a special-purpose machine. According to one embodiment, the techniques herein are performed by computer system 1600 in response to processor 1604 executing one or more sequences of one or more instructions contained in main memory 1606. Such instructions may be read into main memory 1606 from another storage medium, such as storage device 1610. Execution of the sequences of instructions contained in main memory 1606 causes processor 1604 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may include non-volatile media and/or volatile media. Non-volatile media includes, for example, optical or magnetic disks, such as storage device 1610. Volatile media includes dynamic memory, such as main memory 1606. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, an EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire, and fiber optics, including the wires that include bus 1602. Transmission media can also take the form of acoustic or light waves, such as those generated during radio-wave and infra-red data communications.

Various forms of media may be involved in carrying one or more sequences of one or more instructions to processor 1604 for execution. For example, the instructions may initially be carried on a magnetic disk or solid-state drive of a remote computer. The remote computer can load the instructions into its dynamic memory and send the instructions over a network connection. A modem or network interface local to computer system 1600 can receive the data. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also includes a communication interface 1618 coupled to bus 1602. Communication interface 1618 provides a two-way data communication coupling to a network link 1620 that is connected to a local network 1622. For example, communication interface 1618 may be a network card, a modem, a cable modem, or a satellite modem to provide a data communication connection to a corresponding type of telephone line or communications line. Wireless links may also be implemented. In any such implementation, communication interface 1618 sends and receives electrical, electromagnetic, or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the world-wide packet data communication network now commonly referred to as the "Internet" 1628. Local network 1622 and Internet 1628 both use electrical, electromagnetic, or optical signals that carry digital data streams. The signals through the various networks and the signals on network link 1620 and through communication interface 1618, which carry the digital data to and from computer system 1600, are example forms of transmission media.

Computer system 1600 can send messages and receive data, including program code, through the network(s), network link 1620, and communication interface 1618. In the Internet example, a server 1630 might transmit a requested code for an application program through the Internet 1628, ISP 1626, local network 1622, and communication interface 1618. The received code may be executed by processor 1604 as it is received, and/or stored in storage device 1610, or other non-volatile storage for later execution.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. The code may also be provided carried by a transitory computer readable medium e.g., a transmission medium such as in the form of a signal transmitted over a network.

Conjunctive language, such as phrases of the form "at least one of A, B, and C," or "at least one of A, B or C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B or C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

The use of examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

Further embodiments can be envisioned to one of ordinary skill in the art after reading this disclosure. In other embodiments, combinations or sub-combinations of the above-disclosed invention can be advantageously made. The example arrangements of components are shown for purposes of illustration and combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

All references, including publications, patent applications, and patents, cited herein are hereby incorporated by reference to the same extent as if each reference were individually and specifically indicated to be incorporated by reference and were set forth in its entirety herein.

REMARKS

The terms "example," "embodiment," and "implementation" are used interchangeably. For example, reference to "one example" or "an example" in the disclosure can be, but not necessarily are, references to the same implementation; and, such references mean at least one of the implementations. The appearances of the phrase "in one example" are not necessarily all referring to the same example, nor are separate or alternative examples mutually exclusive of other examples. A feature, structure, or characteristic described in connection with an example can be included in another example of the disclosure. Moreover, various features are described which can be exhibited by some examples and not by others. Similarly, various requirements are described which can be requirements for some examples but not other examples.

The terminology used herein should be interpreted in its broadest reasonable manner, even though it is being used in conjunction with certain specific examples of the invention. The terms used in the disclosure generally have their ordinary meanings in the relevant technical art, within the context of the disclosure, and in the specific context where each term is used. A recital of alternative language or synonyms does not exclude the use of other synonyms. Special significance should not be placed upon whether or not a term is elaborated or discussed herein. The use of highlighting has no influence on the scope and meaning of a term. Further, it will be appreciated that the same thing can be said in more than one way.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import can refer to this application as a whole and not to any particular portions of this application. Where context permits, words in the above Detailed Description using the singular or plural number may also include the plural or singular number, respectively. The word "or" in reference to a list of two or more items covers all of the following interpretations of the word: any of the items in the list, all of the items in the list, and any combination of the items in the list. The term "module" refers broadly to software components, firmware components, and/or hardware components.

While specific examples of technology are described above for illustrative purposes, various equivalent modifications are possible within the scope of the invention, as those skilled in the relevant art will recognize. For example, while processes or blocks are presented in a given order, alternative implementations can perform routines having steps, or employ systems having blocks, in a different order, and some processes or blocks may be deleted, moved, added, subdivided, combined, and/or modified to provide alternative or sub-combinations. Each of these processes or blocks can be implemented in a variety of different ways. Also, while processes or blocks are at times shown as being performed in series, these processes or blocks can instead be performed or implemented in parallel, or can be performed at different times. Further, any specific numbers noted herein are only examples such that alternative implementations can employ differing values or ranges.

Details of the disclosed implementations can vary considerably in specific implementations while still being encompassed by the disclosed teachings. As noted above, particular terminology used when describing features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed herein, unless the above Detailed Description explicitly defines such terms. Accordingly, the actual scope of the invention encompasses not only the disclosed examples, but also all equivalent ways of practicing or implementing the invention under the claims. Some alternative implementations can include additional elements to those implementations described above or include fewer elements.

Any patents and applications and other references noted above, and any that may be listed in accompanying filing papers, are incorporated herein by reference in their entireties, except for any subject matter disclaimers or disavowals, and except to the extent that the incorporated material is inconsistent with the express disclosure herein, in which case the language in this disclosure controls. Aspects of the invention can be modified to employ the systems, functions, and concepts of the various references described above to provide yet further implementations of the invention.

To reduce the number of claims, certain implementations are presented below in certain claim forms, but the applicant contemplates various aspects of an invention in other forms. For example, aspects of a claim can be recited in a means-plus-function form or in other forms, such as being embodied in a computer-readable medium. A claim intended to be interpreted as a mean-plus-function claim will use the words "means for." However, the use of the term "for" in any other context is not intended to invoke a similar interpretation. The applicant reserves the right to pursue such additional claim forms in either this application or in a continuing application.

I claim:

1. A method to determine an influence of a deformation of a curve on a surface proximate to the curve, the method comprising:
   obtaining multiple deformations of the curve and multiple desired deformations of the surface,
      wherein a desired deformation of the surface among the multiple desired deformations of the surface corresponds to a deformation of the curve among the multiple deformations of the curve,
      wherein the deformation of the curve among the multiple deformations of the curve includes a first nonrigid deformation,
      wherein the desired deformation of the surface among the multiple desired deformations of the surface includes a second nonrigid deformation,
      wherein the multiple deformations of the curve include the curve, and
      wherein the multiple deformations of the surface include the surface;
   obtaining a first point associated with the surface;
   determining the influence of the deformation of the curve on the surface proximate to the curve by:
      determining a second point associated with the curve and proximate to the first point;
      iterating over each desired deformation of the surface among the multiple desired deformations of the surface and a corresponding curve among the multiple deformations of the curve by:
         determining a desired position of the first point associated with the each desired deformation;
         determining a position of the first point based on a position of the second point associated with the corresponding curve and a parameter indicating the influence;
         calculating a difference between the desired position of the first point and the determined position of the first point;
      based on the difference calculating a total difference;
      reducing the total difference by adjusting the parameter; and
      determining the influence based on the parameter.

2. The method of claim 1, wherein determining the influence of the deformation of the curve on the surface comprises:
   obtaining a third point associated with the surface,
      wherein the influence of the deformation of the curve on the third point associated with the surface is undetermined;
   determining a distance between the third point associated with the surface and the curve; and
   determining the influence of the deformation of the curve on the third point based on the distance,
      wherein the influence is inversely correlated to the distance.

3. The method of claim 1, wherein determining the influence of the deformation of the curve on the surface comprises:
   obtaining a third point associated with the surface,
      wherein the influence of the deformation of the curve on the third point associated with the surface is undetermined;
   obtaining multiple points neighboring the third point, and multiple parameters associated with the multiple points; and
   determining the influence of the deformation of the curve on the third point by averaging the multiple parameters.

4. The method of claim 1, wherein determining the influence of the deformation of the curve on the surface comprises:
   determining that the first point is deformed by multiple curves;
   determining a first influence of a first curve among the multiple curves associated with the first point by:

determining a distance between the first point and the first curve; and
calculating the first influence to be inversely correlated to the distance.

5. The method of claim 1, wherein determining the influence of the deformation of the curve on the surface comprises:
determining that the first point is deformed by multiple curves;
creating a multidimensional space,
wherein a first dimension in the multidimensional space corresponds to a first curve among the multiple curves;
creating a multidimensional Voronoi diagram including multiple Voronoi cells, wherein a center of a Voronoi cell among the multiple Voronoi cells corresponds to the first curve;
determining a location of the first point in the multidimensional space;
based on the location of the first point to the multidimensional space, determining the Voronoi cell to which the first point belongs; and
determining that the first curve associated with the Voronoi cell has a higher influence on the first point than a remainder of the multiple curves.

6. The method of claim 1, comprising:
obtaining multiple attributes associated with the surface;
receiving an indication of a second influence associated with the deformation of the curve,
wherein the second influence associated with the deformation of the curve changes the multiple attributes,
wherein the second influence associated with the deformation of the curve is independent of the influence associated with the deformation of the curve; and
based on the deformation of the curve and the indication of the second influence, interpolating between the multiple attributes associated with the surface.

7. At least one computer-readable storage medium, excluding transitory signals and carrying instructions, which, when executed by at least one data processor of a system, cause the system to:
obtain multiple deformations of a curve and multiple desired deformations of a surface,
wherein a desired deformation of the surface among the multiple desired deformations of the surface corresponds to a deformation of a curve among the multiple deformations of the curve,
wherein the deformation of the curve among the multiple deformations of the curve includes a first nonrigid deformation,
wherein the desired deformation of the surface among the multiple desired deformations of the surface includes a second nonrigid deformation,
wherein the multiple deformations of the curve include the curve, and
wherein the multiple deformations of the surface include the surface;
obtain a first point associated with the surface;
determine an influence of the deformation of the curve on the surface proximate to the curve by:
determining a second point associated with the curve and proximate to the first point;
iterating over each desired deformation of the surface among the multiple desired deformations of the surface and a corresponding curve among the multiple deformations of the curve to:
determine a desired position of the first point associated with each desired deformation;
determine a position of the first point based on a position of the second point associated with the corresponding curve and a parameter indicating the influence;
calculate a difference between the desired position of the first point and the determined position of the first point;
based on the difference, calculating a total difference;
reducing the total difference by adjusting the parameter; and
determining the influence based on the parameter.

8. The computer-readable storage medium of claim 7, the instructions to determine the influence of the deformation of the curve on the surface comprising instructions to:
obtain a third point associated with the surface,
wherein the influence of the deformation of the curve on the third point associated with the surface is undetermined;
determine a distance between the third point associated with the surface and the curve; and
determine the influence of the deformation of the curve on the third point based on the distance,
wherein the influence is inversely correlated to the distance.

9. The computer-readable storage medium of claim 7, the instructions to determine the influence of the deformation of the curve on the surface comprising instructions to:
obtain a third point associated with the surface,
wherein the influence of the deformation of the curve on the third point associated with the surface is undetermined;
obtain multiple points neighboring the third point, and multiple parameters associated with the multiple points; and
determine the influence of the deformation of the curve on the third point by averaging the multiple parameters.

10. The computer-readable storage medium of claim 7, the instructions to determine the influence of the deformation of the curve on the surface comprising instructions to:
determine that the first point is deformed by multiple curves; and
determine a first influence of a first curve among the multiple curves associated with the first point by:
determining a distance between the first point and the first curve; and
calculating the first influence to be inversely correlated to the distance.

11. The computer-readable storage medium of claim 7, the instructions to determine the influence of the deformation of the curve on the surface comprising instructions to:
determine that the first point is deformed by multiple curves;
create a multidimensional space,
wherein a first dimension in the multidimensional space corresponds to a first curve among the multiple curves;
create a multidimensional Voronoi diagram including multiple Voronoi cells, wherein a center of a Voronoi cell among the multiple Voronoi cells corresponds to the first curve;
determine a location of the first point in the multidimensional space;
based on the location of the first point to the multidimensional space, determine the Voronoi cell to which the first point belongs; and determine that the first curve associated with the Voronoi cell has a higher influence on the first point than a remainder of the multiple curves.

12. The computer-readable storage medium of claim 7, comprising instructions to:
obtain multiple attributes associated with the surface; and
based on the deformation of the curve, interpolate between the multiple attributes associated with the surface.

13. The computer-readable storage medium of claim 7, comprising instructions to:
obtain multiple attributes associated with the surface;
receive an indication of a second influence associated with the deformation of the curve,
wherein the second influence associated with the deformation of the curve changes the multiple attributes,
wherein the second influence associated with the deformation of the curve is independent of the influence associated with the deformation of the curve; and
based on the deformation of the curve and the indication of the second influence, interpolate between the multiple attributes associated with the surface.

14. A system comprising:
at least one hardware processor; and
at least one non-transitory memory storing instructions, which, when executed by the at least one hardware processor, cause the system to:
obtain multiple deformations of a curve and multiple desired deformations of a surface,
wherein a desired deformation of the surface among the multiple desired deformations of the surface corresponds to a deformation of the curve among the multiple deformations of the curve,
wherein the deformation of the curve among the multiple deformations of the curve includes a first nonrigid deformation,
wherein the desired deformation of the surface among the multiple desired deformations of the surface includes a second nonrigid deformation,
wherein the multiple deformations of the curve include the curve, and
wherein the multiple deformations of the surface include the surface;
obtain a first point associated with the surface;
determine an influence of the deformation of the curve on the surface proximate to the curve by:
determining a second point associated with the curve and proximate to the first point;
iterating over each desired deformation of the surface among the multiple desired deformations of the surface and a corresponding curve among the multiple deformations of the curve to:
determine a desired position of the first point associated with each desired deformation;
determine a position of the first point based on a position of the second point associated with the corresponding curve and a parameter indicating the influence;
calculate a difference between the desired position of the first point and the determined position of the first point;
based on the difference, calculating a total difference;
reducing the total difference by adjusting the parameter; and
determining the influence based on the parameter.

15. The system of claim 14, the instructions to determine the influence of the deformation of the curve on the surface comprising instructions to:
obtain a third point associated with the surface,
wherein the influence of the deformation of the curve on the third point associated with the surface is undetermined;
determine a distance between the third point associated with the surface and the curve; and
determine the influence of the deformation of the curve on the third point based on the distance,
wherein the influence is inversely correlated to the distance.

16. The system of claim 14, the instructions to determine the influence of the deformation of the curve on the surface comprising instructions to:
obtain a third point associated with the surface,
wherein the influence of the deformation of the curve on the third point associated with the surface is undetermined;
obtain multiple points neighboring the third point, and multiple parameters associated with the multiple points; and
determine the influence of the deformation of the curve on the third point by averaging the multiple parameters.

17. The system of claim 14, the instructions to determine the influence of the deformation of the curve on the surface comprising instructions to:
determine that the first point is deformed by multiple curves;
determine a first influence of a first curve among the multiple curves associated with the first point by:
determining a distance between the first point and the first curve; and
calculating the first influence to be inversely correlated to the distance.

18. The system of claim 14, the instructions to determine the influence of the deformation of the curve on the surface comprising instructions to:
determine that the first point is deformed by multiple curves;
create a multidimensional space,
wherein a first dimension in the multidimensional space corresponds to a first curve among the multiple curves;
create a multidimensional Voronoi diagram including multiple Voronoi cells, wherein a center of a Voronoi cell among the multiple Voronoi cells corresponds to the first curve;
determine a location of the first point in the multidimensional space;
based on the location of the first point to the multidimensional space, determine the Voronoi cell to which the first point belongs; and
determine that the first curve associated with the Voronoi cell has a higher influence on the first point than a remainder of the multiple curves.

19. The system of claim 14, comprising instructions to:
obtain multiple attributes associated with the surface; and
based on the deformation of the curve, interpolate between the multiple attributes associated with the surface.

20. The system of claim 14, comprising instructions to:
obtain multiple attributes associated with the surface;
receive an indication of a second influence associated with the deformation of the curve, wherein the second influence associated with the deformation of the curve changes the multiple attributes,
wherein the second influence associated with the deformation of the curve is independent of the influence associated with the deformation of the curve; and
based on the deformation of the curve and the indication of the second influence, interpolate between the multiple attributes associated with the surface.

* * * * *